(12) United States Patent
Chibvongodze et al.

(10) Patent No.: US 11,081,185 B2
(45) Date of Patent: Aug. 3, 2021

(54) NON-VOLATILE MEMORY ARRAY DRIVEN FROM BOTH SIDES FOR PERFORMANCE IMPROVEMENT

(71) Applicant: SanDisk Technologies LLC, Addison, TX (US)

(72) Inventors: Hardwell Chibvongodze, Hiratsuka (JP); Masatoshi Nishikawa, Nagoya (JP)

(73) Assignee: SanDisk Technologies LLC, Addison, TX (US)

( * ) Notice: Subject to any disclaimer, the term of this patent is extended or adjusted under 35 U.S.C. 154(b) by 160 days.

(21) Appl. No.: 16/444,410

(22) Filed: Jun. 18, 2019

(65) Prior Publication Data

US 2020/0402587 A1  Dec. 24, 2020

(51) Int. Cl.
| | | |
|---|---|---|
| *G11C 16/08* | (2006.01) | |
| *G11C 16/14* | (2006.01) | |
| *H01L 23/528* | (2006.01) | |
| *H01L 27/11582* | (2017.01) | |
| *G11C 16/04* | (2006.01) | |
| *G11C 16/26* | (2006.01) | |
| *H01L 25/18* | (2006.01) | |

(52) U.S. Cl.
CPC .......... *G11C 16/14* (2013.01); *G11C 16/0483* (2013.01); *G11C 16/08* (2013.01); *G11C 16/26* (2013.01); *H01L 23/528* (2013.01); *H01L 25/18* (2013.01); *H01L 27/11582* (2013.01); *G11C 2216/18* (2013.01)

(58) Field of Classification Search
CPC ..... G11C 16/14; G11C 16/0483; G11C 16/26; G11C 16/08; G11C 2216/18; G11C 16/30; G11C 16/32; G11C 11/5635; G11C 11/5642; G11C 16/16; H01L 23/528; H01L 27/11582; H01L 25/18; H01L 27/11575; H01L 27/11565
See application file for complete search history.

(56) References Cited

U.S. PATENT DOCUMENTS

| | | |
|---|---|---|
| 4,488,263 A | 12/1984 | Herndon et al. |
| 5,774,471 A | 6/1998 | Jiang |
| 6,144,610 A | 11/2000 | Zheng et al. |
| 6,731,540 B2 | 5/2004 | Lee et al. |
| 7,379,375 B1 | 5/2008 | Peng |
| 7,672,163 B2 | 3/2010 | Miwa |
| 8,427,874 B2 | 4/2013 | Kato |
| 8,699,293 B2 | 4/2014 | Yan et al. |
| 9,595,535 B1 | 3/2017 | Ogawa et al. |
| 9,653,175 B2 | 5/2017 | Sabde et al. |

(Continued)

FOREIGN PATENT DOCUMENTS

JP  2017054565  3/2017

*Primary Examiner* — Jay W. Radke
(74) *Attorney, Agent, or Firm* — Vierra Magen Marcus LLP

(57) ABSTRACT

A memory device is disclosed configured to share word line switches (WLSW) between each word line of two adjacent erase blocks. The word lines are driven from both sides of the memory array to reduces resistive-capacitive (RC) loading during pre-charge/ramp-up periods and during discharge/ramp-down periods for various storage operations. The dual-sided driving of signals combines with synergistic erase block size management to lower read latency (tR) for non-volatile memory media.

20 Claims, 17 Drawing Sheets

(56) References Cited

U.S. PATENT DOCUMENTS

| | | |
|---|---|---|
| 9,947,682 B2 | 4/2018 | Mokhlesi et al. |
| 10,127,985 B2 | 11/2018 | Yamaoka |
| 2007/0211531 A1 | 9/2007 | Atti et al. |
| 2008/0170433 A1 | 7/2008 | Yamada |
| 2011/0019477 A1* | 1/2011 | Hashimoto ............ G11C 16/06 365/185.11 |
| 2012/0147646 A1 | 6/2012 | Scheuerlein |
| 2012/0182801 A1* | 7/2012 | Lue .................... G11C 11/4097 365/185.05 |
| 2013/0155801 A1 | 6/2013 | Yun et al. |
| 2014/0084936 A1 | 3/2014 | Pan et al. |
| 2014/0300399 A1* | 10/2014 | Miyake ................ G09G 3/3677 327/296 |
| 2015/0046770 A1 | 2/2015 | Luo et al. |
| 2015/0117114 A1 | 4/2015 | Wan et al. |
| 2019/0043883 A1* | 2/2019 | Xu ..................... H01L 27/1157 |

\* cited by examiner

NON-VOLATILE MEMORY ARRAY DRIVEN FROM BOTH SIDES FOR PERFORMANCE IMPROVEMENT

BACKGROUND

It is desirable to increase NAND flash memory performance by reducing latency of storage operations, including writing/storing, reading/accessing, and erasing memory cells of the NAND flash memory. In particular, it is desirable to reduce the time required to read memory cells (tR). Reducing tR enables NAND flash memory to serve as an alternative to dynamic random-access memory (DRAM), as a cache, or as a buffer in solid state drive (SSD) applications.

One challenge in reducing storage operation latency is resistive-capacitive (RC) loading of various signal lines used within, and connected to, three dimensional (3D) NAND flash memory cells, the memory arrays, and the supporting structures. In certain three dimensional (3D) NAND flash memory architectures, word lines (WL) may incur resistive-capacitive (RC) loading during storage operations that negatively impacts tR. To improve tR, it is desirable to reduce the time involved to charge/pre-charge/ramp-up and discharge/ramp-down word lines.

BRIEF SUMMARY

Apparatuses are presented for reducing the pre-charge and discharge time of word lines of a non-volatile memory device. In one embodiment, an apparatus includes three-dimensional array comprising a first set of word lines of storage cells, a second set of word lines of storage cells, and a connection circuit configured to couple each word line of the first set of word lines and each corresponding word line of the second set of word lines to a common driver. In a further embodiment, the apparatus includes a connection circuit that includes a first word line switch configured to connect a selected word line in the first set of word lines and an unselected word line in the second set of word lines to the common driver, and a second word line switch configured to connect the unselected word line in the second set of word lines to the selected word line in the first set of word lines to the common driver.

In certain embodiments, the connection circuit is configured such that the first word line switch supplies a signal to both the selected word line and the unselected word line. In certain embodiments, the connection circuit includes a word line interconnect that connects each word line of the first set of word lines with a corresponding word line of the second set of word lines. In certain embodiments, the word line interconnect includes an external conductive link between one of the word lines in the first set of word lines and the corresponding word line in the second set of word lines.

In certain embodiments, the three-dimensional array includes a trench that separates the word lines of the first set of word lines from the word lines of the second set of word lines and wherein the word line interconnect comprises an internal conductive link between one of the word lines in the first set of word lines and the corresponding word line in the second set of word lines. In certain embodiments, the apparatus includes an erase block comprising a first set of word lines and a second set of word lines, the apparatus also includes a die controller configured to erase the erase block in a single erase operation.

In certain embodiments, the three-dimensional array includes a first erase block comprising a first set of word lines and a second erase block comprising the second set of word lines. the three-dimensional array includes storage cells and is organized into a plurality of erase blocks that includes the first erase block and the second erase block, the first erase block positioned adjacent to the second erase block within the three-dimensional array.

An apparatus, in another embodiment, includes a three-dimensional array of NAND strings coupled to word lines, the three-dimensional array comprising a selected erase block and an unselected erase block with a trench between the selected erase block and the unselected erase block, a word line interconnect configured to electrically couple each word line of the selected erase block to a corresponding word line of the unselected erase block, the corresponding word line positioned in a common layer of the three-dimensional array, a connection circuit configured to selectively couple one or more of the word lines of the selected erase block and one or more of the word lines of the unselected erase block to a common driver, and a die controller configured to bias the NAND strings within the selected erase block and bias NAND strings within the unselected erase block in order to execute a storage operation on storage cells of the selected erase block and mitigate effects of the storage operation on storage cells of the unselected erase block. Certain embodiments of the apparatus include a first source line coupled to the selected erase block and a second source line coupled to the unselected erase block and wherein the die controller is configured to bias the NAND strings of the selected erase block and the NAND strings of the unselected erase block to execute an erase operation on the storage cells of the selected erase block, with minimal, or no, effect on storage cells of the unselected erase block.

In one embodiment, a method for performing a read operation is provided, the method performed by a storage controller. The controller turns drain select gates of the NAND strings off to float the NAND strings. The controller applies a read voltage to a selected word line of a selected erase block from both ends of the selected word line, the read voltage applied concurrently to a corresponding word line of the unselected erase block from both ends of the corresponding word line by way of a word line interconnect. The controller applies a pass voltage to unselected word lines of the selected erase block from both sides of the unselected word lines, the pass voltage applied concurrently to unselected word lines of the unselected erase block from both ends by way of a word line interconnect. The controller senses a read state for storage cells on the selected word line.

An apparatus, in another embodiment, includes a three-dimensional array of NAND strings coupled to word lines, the three-dimensional array comprising a selected erase block and an unselected erase block with a trench dividing the selected erase block and the unselected erase block, a means for electrically coupling each of the word lines of the selected erase block to a corresponding word line of the unselected erase block, the corresponding word line positioned in a common layer of the three-dimensional array, a means for selectively coupling a selected word line of the selected erase block and an unselected word line of the unselected erase block to one or more common drivers, and a means for biasing NAND strings within the selected erase block and biasing NAND strings of the unselected erase block in order to execute a storage operation on storage cells of the selected erase block and mitigate effects of the storage operation on storage cells of the unselected erase block. In certain embodiments that include a die controller, the die controller is configured to activate a first word line switch and a second word line switch at opposite ends the selected word line substantially simultaneously to propagate signals across the selected word line from two opposite ends.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

A memory device is disclosed configured to share word line switches (WLSW) between two word lines (WLs) from two adjacent erase blocks. The word lines are driven from both sides of the memory array to reduce resistive-capacitive (RC) delay during pre-charge/ramp-up periods and during discharge/ramp-down periods for each storage operation. This dual-sided operation is combined synergistically with page size management to significantly lower read time (tR) for flash memory.

WLSW transfer high voltages and consequently are large in comparison to other electrical components of a memory array. Conventional memory arrays do not share WLSWs among word lines. Sharing WLSW between word lines of adjacent erase blocks simplifies row decoder connections and layout in general for improved memory die scaling. Furthermore, the sharing enables the use of less accurate/expensive lithography tools during fabrication in certain embodiments.

Figure 1:
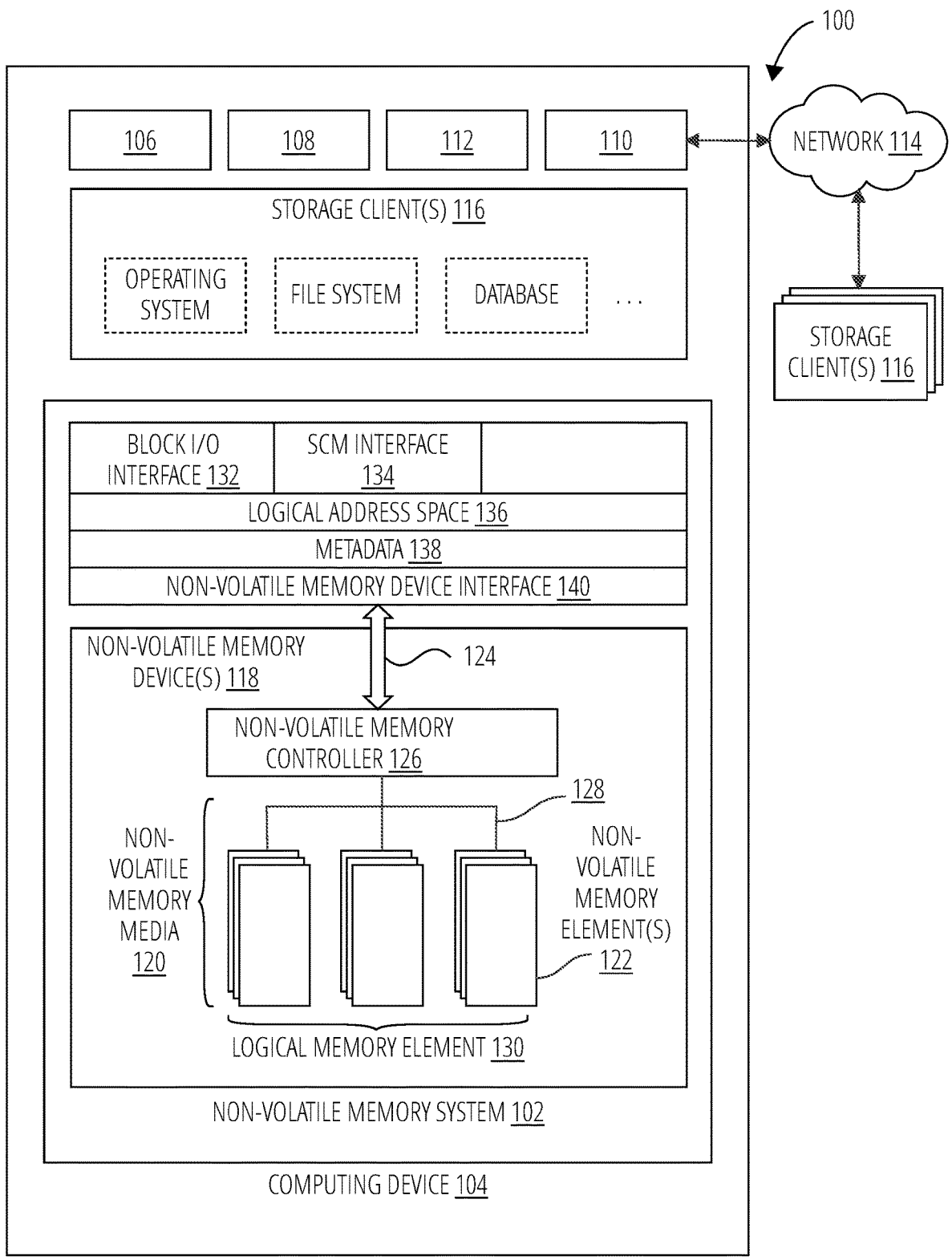
FIG. 1 is a schematic block diagram illustrating one embodiment of a system 100 for mitigating RC loading.

FIG. 1 is a block diagram of one embodiment of a system 100 comprising non-volatile memory device(s) 118 configured in accordance with an embodiment of the claimed solution. A computing device 104 may comprise non-volatile memory system 102, a processor 106, volatile memory 108, and a communication interface 110. The processor 106 may comprise one or more central processing units, one or more general-purpose processors, one or more application-specific processors, one or more virtual processors (e.g., the computing device 104 may be a virtual machine operating within a host), one or more processor cores, or the like. The communication interface 110 may comprise one or more network interfaces configured to communicatively couple the computing device 104 and/or non-volatile memory controller 126 to a communication network 114, such as an Internet Protocol (IP) network, a Storage Area Network (SAN), wireless network, wired network, or the like.

The non-volatile memory device(s) 118, in various embodiments, may be disposed in one or more different locations relative to the computing device 104. In one embodiment, the non-volatile memory device(s) 118 comprises one or more non-volatile memory element(s) 122, such as semiconductor chips, memory die, or packages or other integrated circuit devices disposed on one or more printed circuit boards, storage housings, and/or other mechanical and/or electrical support structures. For example, the non-volatile memory device(s) 118 may comprise one or more direct inline memory module (DIMM) cards, one or more expansion cards and/or daughter cards, a solid-state-drive (SSD) or other hard drive device, and/or may have another memory and/or storage form factor known to those of skill in the art. The non-volatile memory device(s) 118 may be integrated with, and/or mounted on, a motherboard of the computing device 104, installed in a port and/or slot of the computing device 104, installed on a different computing device 104 and/or a dedicated storage appliance on the network 114, in communication with the computing device 104 over an external bus (e.g., an external hard drive), or the like.

The non-volatile memory device(s) 118, in one embodiment, may be disposed on a memory bus of a processor 106 (e.g., on the same memory bus as the volatile memory 108, on a different memory bus from the volatile memory 108, in place of the volatile memory 108, or the like). In a further embodiment, the non-volatile memory device(s) 118 may be disposed on a peripheral bus of the computing device 104, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device(s) 118 may be disposed on a data network 114, such as an Ethernet network, an Infiniband network, SCSI RDMA over a network 114, a storage area network (SAN), a local area network (LAN), a wide area network (WAN) such as the Internet, another wired and/or wireless network 114, or the like.

The computing device 104 may further comprise a non-transitory, computer readable storage medium 112. The computer readable storage medium 112 may comprise executable instructions configured to cause the computing device 104 (e.g., processor 111) to perform steps of one or more of the methods disclosed herein.

According to various embodiments, a non-volatile memory controller 126 may manage one or more non-volatile memory device(s) 118 and/or non-volatile memory element(s) 122. The non-volatile memory device(s) 118 may comprise recording, memory, and/or storage devices, such as solid-state storage device(s) and/or semiconductor storage device(s) that are arranged and/or partitioned into a plurality of addressable storage locations. As used herein, a storage location refers to any physical unit of memory (e.g., any quantity of physical storage media on a non-volatile memory device(s) 118). Memory units may include, but are not limited to: pages, memory divisions, blocks, data blocks, erase blocks, sectors, collections or sets of physical storage locations (e.g., logical pages, logical blocks, logical erase blocks), or the like.

A device driver and/or the non-volatile memory controller 126, in certain embodiments, may present a logical address space 136 to the storage client(s) 116. As used herein, a logical address space 136 refers to a logical representation of memory resources. The logical address space 136 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device(s) 118 may maintain metadata 138, such as a logical to physical address mapping structure, to map logical addresses of the logical address space 136 to storage location on the non-volatile memory device(s) 118. A device driver may be configured to provide storage services to one or more storage client(s) 116. The storage client(s) 116 may include local storage client(s) 116 operating on the computing device 104 and/or remote, storage client(s) 116 accessible via the network 114 and/or communication interface 110. The storage client(s) 116 may include, but are not limited to: operating systems, file systems, database applications, server applications, kernel-level processes, user-level processes, applications, and the like.

A device driver may be communicatively coupled to one or more non-volatile memory device(s) 118. The one or more non-volatile memory device(s) 118 may include different types of non-volatile memory devices including, but not limited to: solid-state storage devices, semiconductor storage devices, SAN storage resources, or the like. The one or more non-volatile memory device(s) 118 may comprise one or more of a respective non-volatile memory controller 126 and/or non-volatile memory media 120. A device driver may provide access to the one or more non-volatile memory device(s) 118 via a traditional block I/O interface 132. Additionally, a device driver may provide access to other functionality through the storage class memory interface (SCM interface 134). The metadata 138 may be used to manage and/or track data operations performed through any of the block I/O interface 132, SCM interface 134, or other, related interfaces.

In one embodiment, a user application such as software application operating on or in conjunction with the storage client(s) 116 uses the non-volatile memory system 102. The storage client(s) 116 manage files and data and utilizes the functions and features of the non-volatile memory controller 126 and associated non-volatile memory media 120. Representative examples of storage clients include, but are not limited to, a server, a file system, an operating system, a database management system ("DBMS"), a volume manager, and the like. In one embodiment, the storage client(s) 116 access to the one or more non-volatile memory device(s) 118 via a traditional block I/O interface 132.

Certain conventional block storage devices divide the storage media into volumes or partitions. Each volume or partition may include a plurality of sectors. One or more sectors are organized into a block (also referred to as a data block). In certain storage systems, such as those interfacing with the Windows® operating systems, the data blocks are referred to as clusters. In other storage systems, such as those interfacing with UNIX, Linux, or similar operating systems, the data blocks are referred to simply as blocks. A block or cluster represents a smallest physical amount of storage space on the storage media that is managed by the non-volatile memory controller 126. A block storage device may associate n blocks available for user data storage across the non-volatile memory media 120 with a logical block address, numbered from 0 to n. In certain block storage devices, the logical block addresses may range from 0 to n per volume or partition. In conventional block storage devices, a logical block address maps directly to a particular logical block.

A device driver may present a logical address space 136 to the storage client(s) 116 through one or more interfaces. As discussed above, the logical address space 136 may comprise a plurality of logical addresses, each corresponding to respective storage locations within the one or more non-volatile memory device(s) 118. A device driver may maintain metadata 138 comprising any-to-any mappings between logical addresses and storage locations, or the like.

A device driver may further comprise and/or be in communication with a non-volatile memory device interface 140 configured to transfer data, commands, and/or queries to the one or more non-volatile memory device(s) 118 over a bus 124, which may include, but is not limited to: a memory bus of a processor 106, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 114, Infiniband, SCSI RDMA, non-volatile memory express (NVMe), or the like. The non-volatile memory device interface 140 may communicate with the one or more non-volatile memory device(s) 118 using input-output control (IO-CTL) command(s), IO-CTL command extension(s), remote direct memory access, or the like.

The communication interface 110 may comprise one or more network interfaces configured to communicatively couple the computing device 104 and/or the non-volatile memory controller 126 to a network 114 and/or to one or more remote, network-accessible storage client(s) 116. The storage client(s) 116 may include local storage client(s) 116 operating on the computing device 104 and/or remote, storage client(s) 116 accessible via the network 114 and/or the communication interface 110. The non-volatile memory controller 126 is part of and/or in communication with one or more non-volatile memory device(s) 118. Although FIG. 1 depicts a single non-volatile memory device(s) 118, the disclosure is not limited in this regard and could be adapted to incorporate any number of non-volatile memory device(s) 118.

The non-volatile memory device(s) 118 may comprise one or more non-volatile memory element(s) 122 of non-volatile memory media 120, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more non-volatile memory element(s) 122 of non-volatile memory media 120, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory element(s) 122 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 120 is referred to herein as "memory media," in various embodiments, the non-volatile memory media 120 may more generally comprise one or more non-volatile recording media capable of recording data, which may be referred to as a non-volatile memory medium, a non-volatile storage medium, or the like. Further, the non-volatile memory device(s) 118, in various embodiments, may comprise a non-volatile recording device, a non-volatile memory device, a non-volatile storage device, or the like.

The non-volatile memory media 120 may comprise one or more non-volatile memory element(s) 122, which may include, but are not limited to: chips, packages, planes, die, or the like. A non-volatile memory controller 126 may be configured to manage data operations on the non-volatile memory media 120, and may comprise one or more processors, programmable processors (e.g., FPGAs), ASICs, micro-controllers, or the like. In some embodiments, the non-volatile memory controller 126 is configured to store data on and/or read data from the non-volatile memory media 120, to transfer data to/from the non-volatile memory device(s) 118, and so on.

The non-volatile memory controller 126 may be communicatively coupled to the non-volatile memory media 120 by way of a bus 128. The bus 128 may comprise a bus for communicating data to/from the non-volatile memory element(s) 122. The bus 128, in one embodiment, may further comprise a control bus for communicating addressing and other command and control information to the non-volatile memory element(s) 122. In some embodiments, the bus 128 may communicatively couple the non-volatile memory element(s) 122 to the non-volatile memory controller 126 in parallel. This parallel access may allow the non-volatile memory element(s) 122 to be managed as a group, forming a logical memory element 130. The logical memory element 130 may be partitioned into respective logical memory units (e.g., logical pages) and/or logical memory divisions (e.g., logical data blocks, logical blocks, logical erase blocks). The logical memory units may be formed by logically combining physical memory units of each of the non-volatile memory element(s) 122.

In some embodiments, the non-volatile memory controller 126 may be configured to store data on one or more asymmetric, write-once media, such as non-volatile memory media 120. As used herein, a "write once" storage medium refers to a storage medium that is reinitialized (e.g., erased) each time new data is written or programmed thereon. As used herein, an "asymmetric" storage medium refers to a storage medium having different latencies for different storage operations. Many types of non-volatile memory media 120 are asymmetric; for example, a read operation may be much faster than a write/program operation, and a write/program operation may be much faster than an erase operation (e.g., reading the media may be hundreds of times faster than erasing, and tens of times faster than programming the media).

The non-volatile memory media 120 may be partitioned into memory divisions that can be erased as a group (e.g., erase blocks) in order to, inter alia, account for the asymmetric properties of the media. As such, modifying a single data sector or data block in-place may require erasing the entire erase block comprising the data, and rewriting the modified data to the erase block, along with the original, unchanged data. This may result in inefficient "write amplification," which may excessively wear the non-volatile memory media 120.

Therefore, in some embodiments, the non-volatile memory controller 126 may be configured to write data out-of-place. As used herein, writing data "out-of-place" refers to writing data to different physical storage location(s) rather than overwriting the data "in-place" (e.g., overwriting the data in the original physical location). Modifying data out-of-place may avoid write amplification, since existing, valid data on the erase block with the data to be modified need not be erased and rewritten. Moreover, writing data out-of-place may remove erasure from the latency impact of certain storage operations.

The non-volatile memory controller 126 may be organized according to a plurality of erase blocks of word lines within a non-volatile memory element(s) 122, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of an erase block within a non-volatile memory element(s) 122 may be physically arranged in a monotonically increasing sequence of word line addresses, with consecutively addressed word lines also being physically adjacent (e.g., WL0, WL1, WL2, . . . WLN).

The non-volatile memory controller 126 may comprise and/or be in communication with a device driver executing on the computing device 104. A device driver may provide storage services to the storage client(s) 116 via one or more interfaces (block I/O interface 132, SCM interface 134, and/or others). In some embodiments, a device driver provides a computing device 104 block I/O interface 132 through which storage client(s) 116 perform block-level I/O operations. Alternatively, or in addition, a device driver may provide an SCM interface 134, which may provide other storage services to the storage client(s) 116. In some embodiments, the SCM interface 134 may comprise extensions to the block I/O interface 132 (e.g., storage client(s) 116 may access the SCM interface 134 through extensions or additions to the block I/O interface 132). Alternatively, or in addition, the SCM interface 134 may be provided as a separate API, service, and/or library.

A device driver may further comprise a non-volatile memory device interface 140 that is configured to transfer data, commands, and/or queries to the non-volatile memory controller 126 over a bus 124, as described above.

Figure 2:
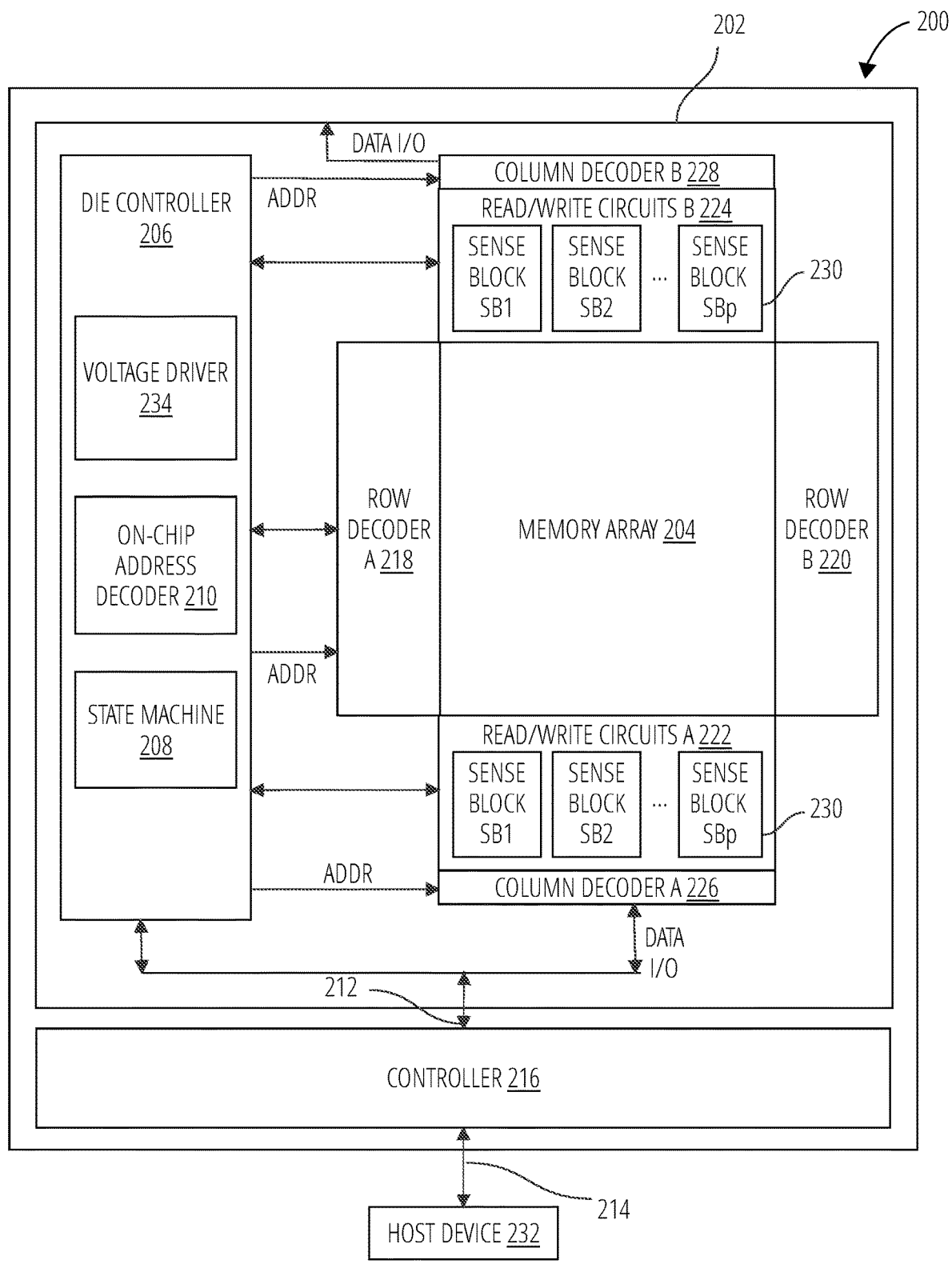
FIG. 2 is a schematic block diagram illustrating another embodiment of a system 200 for mitigating RC loading.

FIG. 2 illustrates an embodiment of a non-volatile storage system 200 that may include one or more memory die(s) 202 or chips. Memory die(s) 202, in some embodiments, include a memory array 204 (two-dimensional or three dimensional) of memory cells, die controller 206, read/write circuits A 222, and read/write circuits B 224. In one embodiment, access to the memory array 204 by the various peripheral circuits is implemented in a symmetric fashion, on opposite sides of the array, so that the densities of access lines and circuitry on each side are reduced by half. The read/write circuits A 222 and read/write circuits B 224, in a further embodiment, include multiple sense amplifiers 230 which allow a page of memory cells to be read or programmed in parallel.

The memory array 204, in various embodiments, is addressable by word lines via row decoder A 218 and row decoder B 220 and by bit lines via column decoder A 226 and column decoder B 228. In some embodiments, a controller 216 is included in the same memory system 200 (e.g., a removable storage card or package) as the one or more memory die(s) 202. Commands and data are transferred between the host device 232 and controller 216 via lines 214 and between the controller and the one or more memory die(s) 202 via lines 212. One implementation can include multiple memory die(s) 202.

Die controller 206, in one embodiment, cooperates with the read/write circuits A 222 and read/write circuits B 224 to perform storage/memory operations on the memory array 204. The die controller 206, in certain embodiments, includes a voltage driver 234, a state machine 208, and an on-chip address decoder 210. In one embodiment, the state machine 208 comprises at least a portion of the voltage driver 234. In another embodiment, the controller 216 comprises at least a portion of the voltage driver 234.

The voltage driver 234, in one embodiment, is configured to supply a voltage to one or more components of the memory array. The magnitude of the voltage and whether the voltage level supplied is increasing or decreasing depends on the operation that the die controller 206 is implementing. At one point during an operation, the voltage level provided by the voltage driver 234 may comprise an analog signal increasing from ground or zero voltage, or a level substantially close to zero, to a desired voltage level required by components coupled to the voltage driver 234 to implement the desired operation. As the voltage applied to a component coupled to the voltage driver 234 increases, the period of time during which the voltage level is changing is referred to herein as charging, pre-charging, or ramping up.

At another point during an operation, the voltage level provided by the voltage driver 234 may comprise an analog signal configured to maintain a voltage level required by components coupled to the voltage driver 234 for a particular stage of implementing a desired operation. As the voltage applied to a component coupled to the voltage driver 234 remains substantially at the desired voltage level, the period of time is referred to herein as a steady state or stable.

At another point during an operation, the voltage level provided by the voltage driver 234 may comprise an analog signal decreasing from a desired voltage level to a lower voltage level, a ground level, or zero voltage, or a level substantially close to zero, for a desired operation. As the voltage applied to a component coupled to the voltage driver 234 decreases the period during which the voltage level is changing is referred to herein as discharging, post-charging, or ramping down.

The state machine 208, in one embodiment, provides chip-level control of storage and/or memory operations. The on-chip address decoder 210 provides an address interface to convert between the address that is used by the host or a memory controller to the hardware address used by the row decoder A 218, row decoder B 220, column decoder A 226a, and column decoder B 228. The state machine 208 includes logic for activating and controlling the voltage driver 234 and other logic coupled to circuits in electrical communication with the voltage driver 234.

In one embodiment, one or any combination of die controller 206, voltage driver 234, on-chip address decoder 210, state machine 208, row decoder A 218, row decoder B 220, column decoder A 226, column decoder B 228, read/write circuits A 222, read/write circuits B 224, and/or controller 216 can be referred to as one or more managing circuits.

Figure 3:
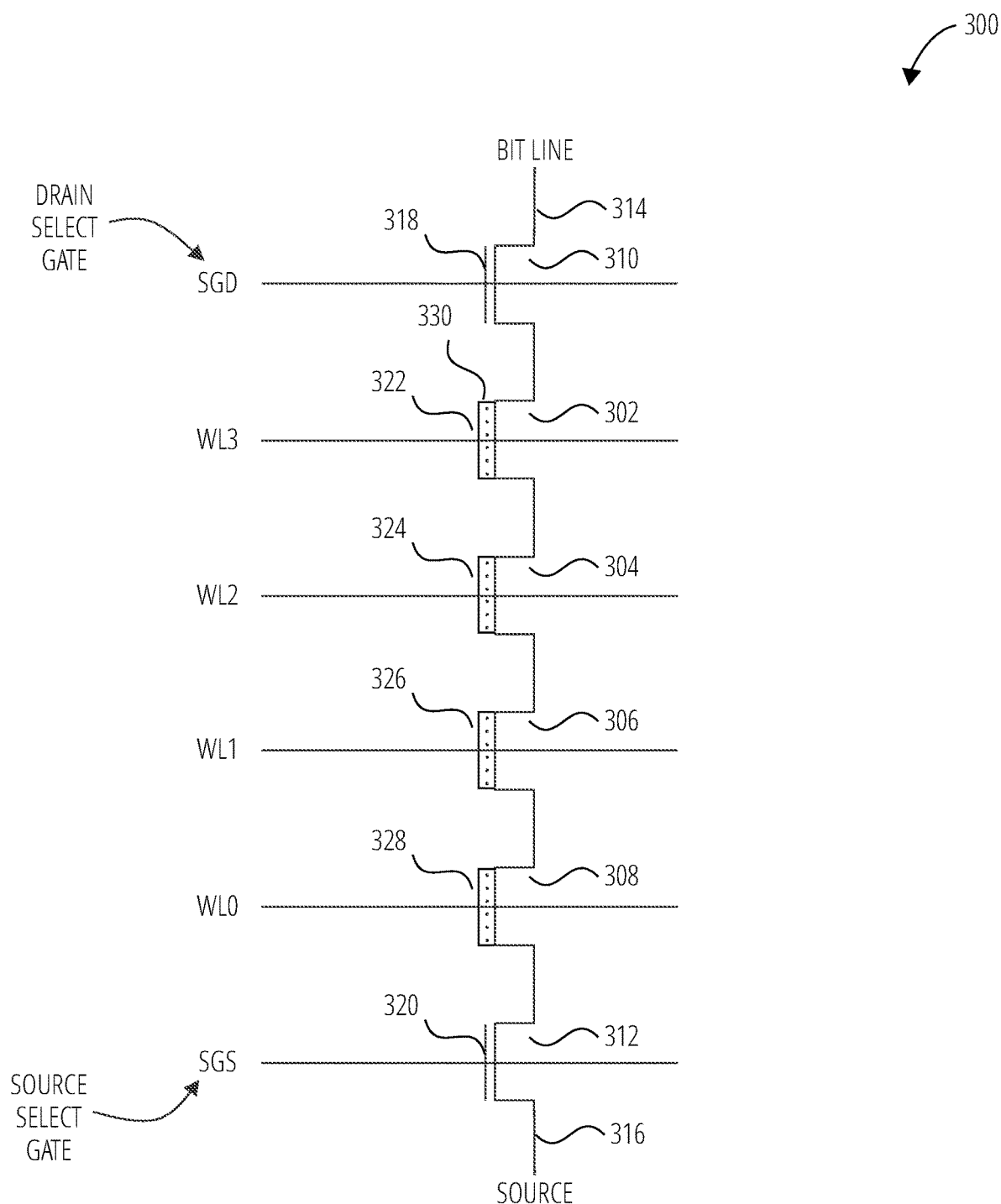
FIG. 3 is a schematic block diagram illustrating one embodiment of a NAND string 300.

FIG. 3 depicts one embodiment of a NAND string 300 comprising a plurality of storage cells. The NAND string 300 depicted in FIG. 3, in some embodiments, includes four transistors (transistor 302, transistor 304, transistor 306, and transistor 308) connected in series and located between a first select transistor 310 and a second select transistor 312. In some embodiments, the transistor 302, transistor 304, transistor 306, and transistor 308 each include a control gate with a charge trap layer 330. Control gate 322, control gate 324, control gate 326, and control gate 328, in one embodiment, are connected to, or comprise a portion of, a word line. In a further embodiment, transistor 302, transistor 304, transistor 306, and transistor 308 are storage cells, storage elements, or the like, also referred to as memory cells. In some embodiments, a single storage cell may include multiple transistors.

The first select transistor 310, in some embodiments, gates/connects the NAND string 300 to a bit line 314 via a drain select gate/select gate drain (SGD). The second select transistor 312, in certain embodiments, gates/connects the NAND string 300 to a source line 316 via a source select gate/select gate source (SGS). The first select transistor 310, in a further embodiment, is controlled by applying a voltage to a corresponding select gate 318. The second select transistor 312, in some embodiments, is controlled by applying a voltage to corresponding select gate 320.

As shown in FIG. 3, the source line 316, in one embodiment, is connected to the sources of each transistor/storage cell in the NAND string 300. The NAND string 300, in some embodiments, may include some storage cells that have been programmed and some storage cells that have not been programmed.

Figure 4:
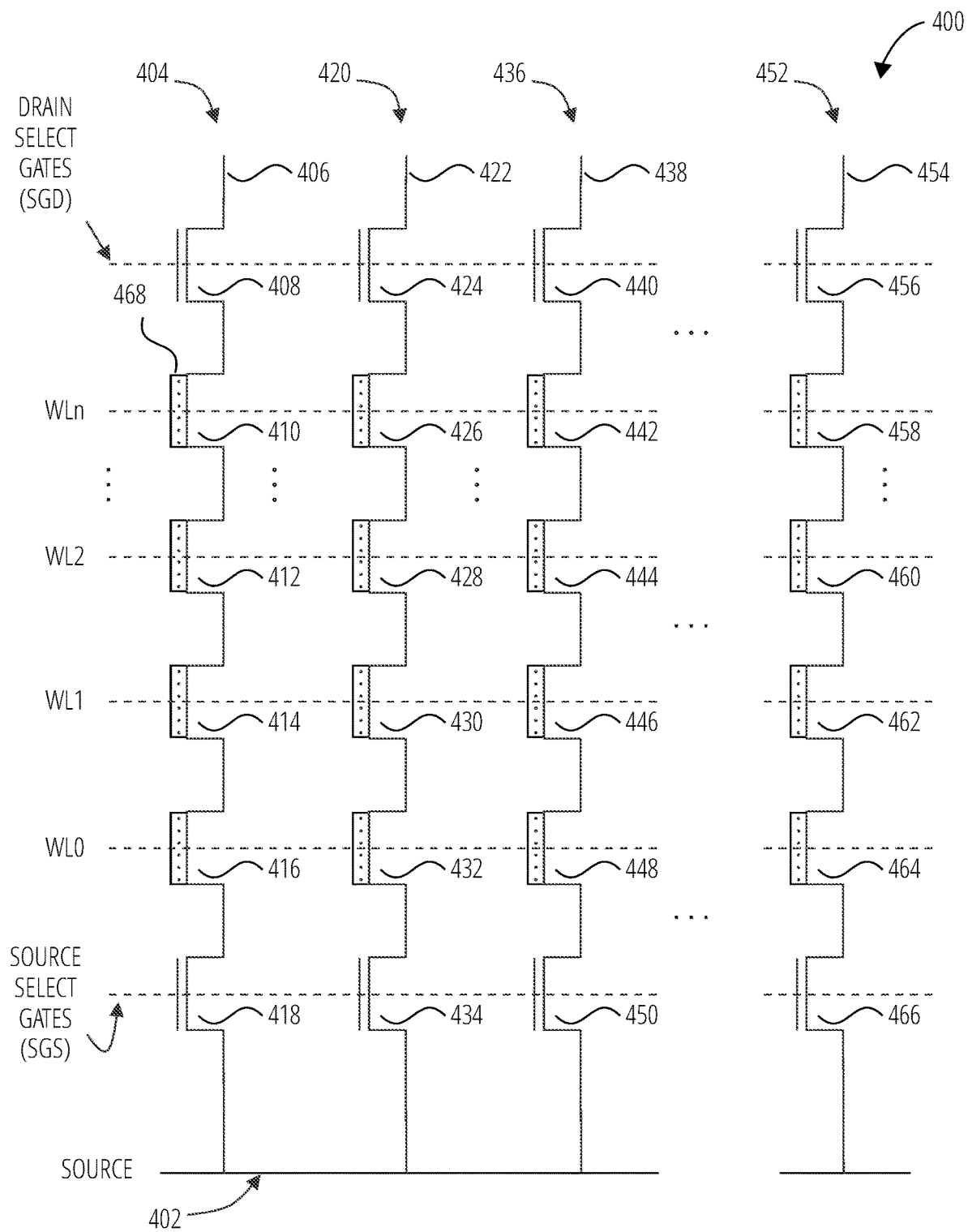
FIG. 4 is a schematic block diagram illustrating one embodiment of a memory array 400.

FIG. 4 is a circuit diagram depicting a memory array 400 comprising a plurality of NAND strings. An architecture for a memory array using a NAND structure may include a significant number of NAND strings. For example, FIG. 4 illustrates a memory array 400 that includes NAND string 404, NAND string 420, NAND string 436, and NAND string 452. In the depicted embodiment, each NAND string includes drain select transistors (select transistor 408, select transistor 424, select transistor 440, and select transistor 456), source select transistors (select transistor 418, select transistor 434, select transistor 450, select transistor 466), and storage elements (storage cell 410, storage cell 412, storage cell 414, storage cell 416, storage cell 426, storage cell 428, storage cell 430, storage cell 432, storage cell 442, storage cell 444, storage cell 446, storage cell 448, storage cell 458, storage cell 460, storage cell 462, and storage cell 464). The storage cells may be transistors that incorporate a charge trap layer 468. While four storage elements per NAND string are illustrated for simplicity, some NAND strings can include any number of storage elements, e.g., thirty-two, sixty-four, or the like storage elements.

NAND string 404, NAND string 420, NAND string 436, and NAND string 452, in one embodiment, are connected to a source line 402 by source select transistor 418, select transistor 434, select transistor 450, and select transistor 466, respectively. A source select line SGS may be used to control the source side select transistors, 418, 434, 450,466. The various NAND strings, in one embodiment, are connected to bit line 406, bit line 422, bit line 438, and bit line 454 by drain select transistor 408, select transistor 424, select transistor 440, and select transistor 456, respectively, as shown. The drain select transistors may be controlled by a drain select line SGD. In some embodiments, the select lines do not necessarily need to be in common among the NAND strings; that is, different select lines can be provided for different NAND strings.

As described above, each word line WL0-WLn connects one or more storage cells. In the depicted embodiment, bit line 406, bit line 422, bit line 438, and bit line 454, and the respective NAND string 404, NAND string 420, NAND string 436, and NAND string 452, form the respective columns of the memory array 400, storage block, erase block, or the like. These columns may also be referred to as channels. The word lines WL0-WLn, in some embodiments, comprise the rows of the memory array 400, storage block, erase block, or the like. Each word line WL0-WLn, in some embodiments, connects the control gates of each storage cell in a row. Alternatively, the control gates may be provided by the word lines WL0-WLn themselves. In some embodiments, a word line WL0-WLn may include tens, hundreds, thousands, millions, or the like of storage cells.

In one embodiment, each storage cell is configured to store data. For example, when storing one bit of digital data, the range of possible threshold voltages ("VTH") of each storage cell may be divided into two ranges which are assigned logical data "1" and "0." As used herein, threshold voltage refers to a magnitude of voltage applied to the gate of a storage cell sufficient to cause the storage cell to activate. In embodiments, in which the storage cell is a NAND transistor, the threshold voltage is a sufficient voltage applied to a gate terminal of the transistor that causes the transistor to conduct current between its source terminal and drain terminal. In one example of a NAND type flash memory, the VTH may be negative after the storage cells are erased, and defined as logic "1." In one embodiment, the VTH after a program operation is positive and defined as logic "0."

When the VTH is negative and a read is attempted, in some embodiments, storage cells will turn on to indicate logic "1" is being stored. When the VTH is positive and a read operation is attempted, in a further embodiment, a storage cell will not turn on, which indicates that logic "0" is stored. Each storage cell may also store multiple levels of information, for example, multiple bits of digital data. In such an embodiment, the range of VTH value is divided into the number of levels of data. For example, if four levels of information can be stored in each storage cell, there will be four VTH ranges assigned to the data values "11", "10", "01", and "00."

In one example of a NAND type memory, the VTH after an erase operation may be negative and defined as "11." Positive VTH values may be used for the states of "10", "01", and "00." In one embodiment, the specific relationship between the data programmed into the storage cells and the threshold voltage ranges of the storage cells depends upon the data encoding scheme adopted for the storage cells.

Figure 5:
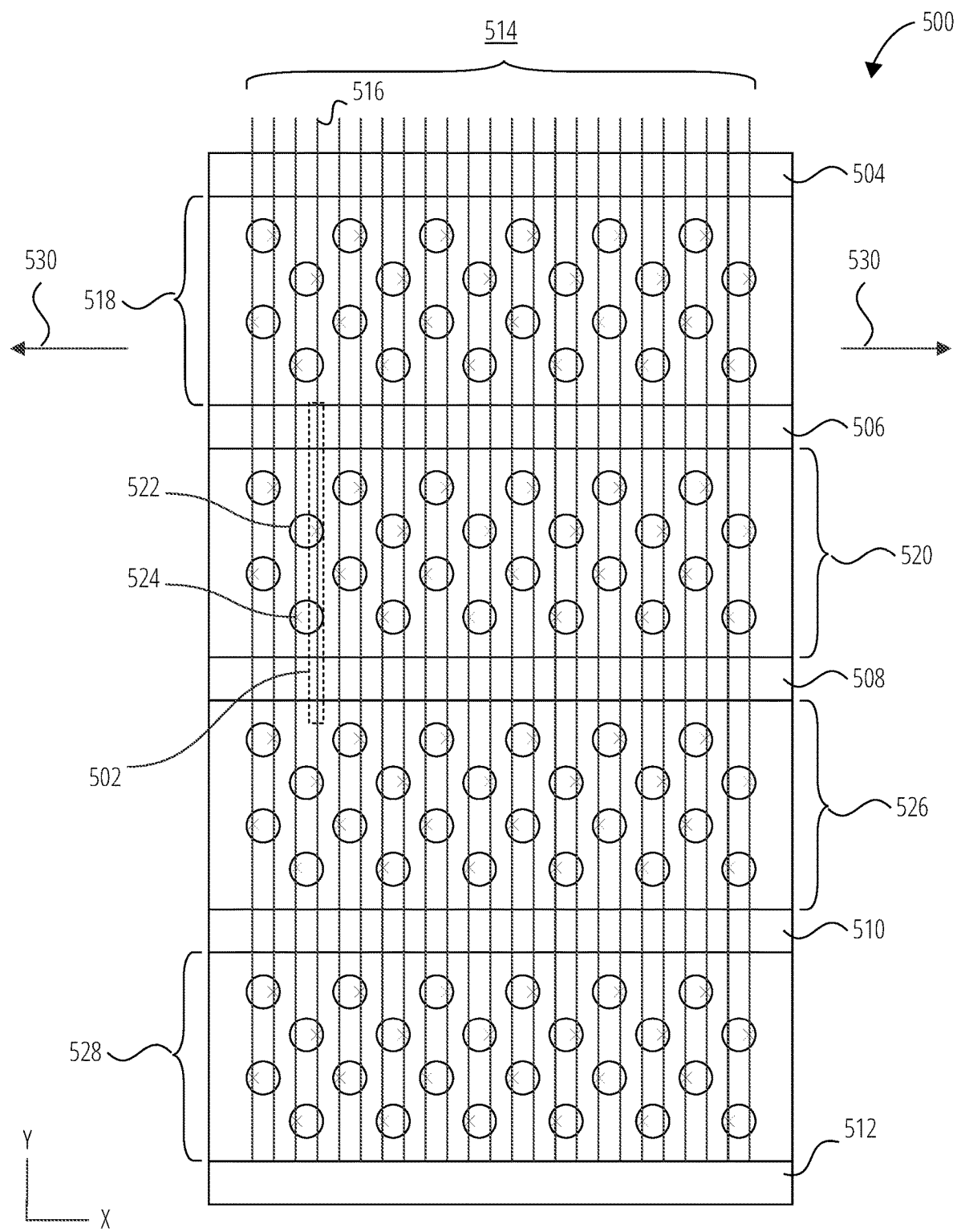
FIG. 5 illustrates one embodiment of a top view of a portion of a memory array 500.
Figure 6:
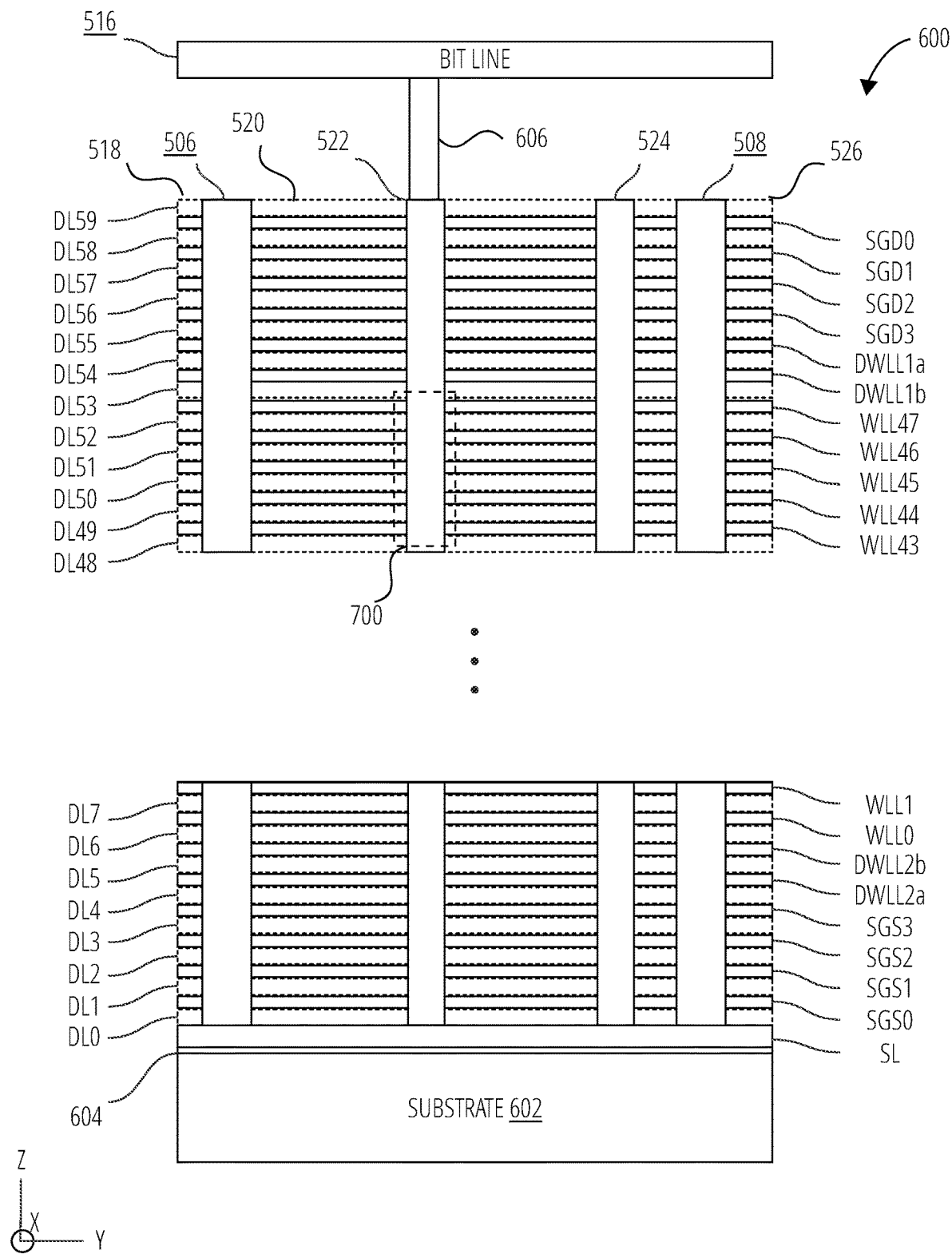
FIG. 6 illustrates one embodiment of a cross-sectional view of a portion of a memory array 502.
Figure 7:
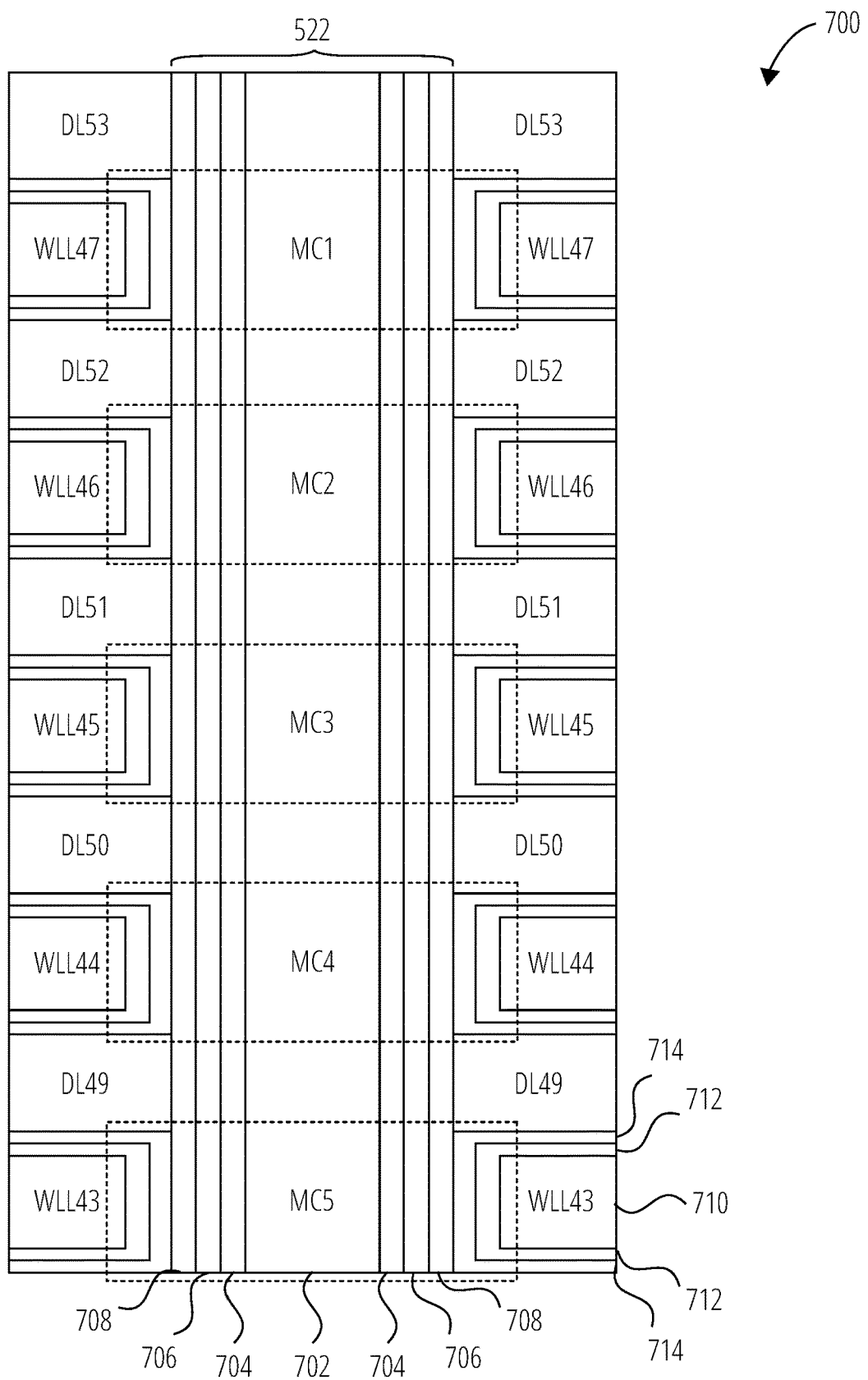
FIG. 7 illustrates a cross-sectional view of a memory array 700.

FIG. 5-FIG. 7 depict different views of an example three dimensional memory array. FIG. 5 is a block diagram depicting a top view of a portion of three dimensional memory array. As can be seen from FIG. 5, the memory array extends 530 in the direction of the arrows shown. In one embodiment, the memory array may have between 60-128 layers. Other embodiments may have less than or more than 60-128 layers. However, FIG. 5 shows the top layer.

FIG. 5 depicts a top view of a portion of a memory array 500. A plurality of circles represent the vertical columns (e.g., vertical column 522 and vertical column 524 also referred to as channels). Each of the vertical columns includes multiple select transistors and multiple storage cells. In one embodiment, each of the vertical columns implements a NAND string. More details of the vertical columns are provided below. Since the memory array extends 530 in the direction of the two arrows shown, an erase block includes more vertical columns 522 than depicted in FIG. 5.

FIG. 5 also depicts a set of bit lines 514. FIG. 5 shows twenty-four bit lines because only a portion of an erase block is depicted. It is contemplated that more than twenty-four bit lines are connected to vertical columns of the erase block. Each of the circles representing vertical columns has an "x" to indicate its connection to one bit line 516.

The portion of erase block depicted in FIG. 5 includes a set of openings (trench 504, trench 506, trench 508, trench 510, and trench 512). A trench separates layers of the three-dimensional array so that smaller divisions can be used in particular storage operations. For example, in FIG. 5, the trenches, together with separate source line connections, break up a monolithic memory array into portions 518, 520, 526, 528 of four illustrated erase blocks. These trenches facilitate performing an erase operation on one erase block without adversely impacting other erase blocks. Trenches may also be used for other routing signals and in such embodiments be referred to as interconnects or local interconnects. For example, in one embodiment, connections to a source gate select line may connect to the source line by way of a line within one or more trenches.

Although FIG. 5 shows each region having four rows of vertical columns, four portions and sixteen rows of vertical columns, those exact numbers are an example implementation. Other embodiments may include more or less regions, more or less rows of vertical columns per region and more or less rows of vertical columns per block.

FIG. 5 also shows the vertical columns being staggered. In other embodiments, different patterns of staggering can be used. In some embodiments, the vertical columns are not staggered.

FIG. 6 depicts a portion of an embodiment of the non-volatile memory media 120 showing a cross-sectional view of a portion of a memory array 600. As indicated in FIG. 5, this cross-sectional view cuts through vertical column 522 and vertical column 524 and 520 (see FIG. 5). The structure of FIG. 6 includes four drain side select layers SGD0, SGD1, SGD2, and SGD3; four source side select layers SGS0, SGS1, SGS2, and SGS3; four dummy word line layers DWLL1 a, DWLL1 b, DWLL2 a, and DWLL2 b; and forty-eight data word line layers WLL0-WLL47 for connecting to data memory cells. Other embodiments can implement more or less than four drain side select layers, more or less than four source side select layers, more or less than four dummy word line layers, and more or less than forty-eight word line layers. Vertical column 522 and vertical column 524 are depicted protruding through the drain side select layers, source side select layers, dummy word line layers and word line layers. In one embodiment, each vertical column comprises a NAND string. Below the vertical columns and the layers listed below is a substrate 602, an insulating film 604 on the substrate 602, and source line 316 (SL). The NAND string of vertical column 522 has a source end at a bottom of the stack and a drain end at a top of the stack. As in agreement with FIG. 5, FIG. 6 shows vertical column 522 connected to bit line 516 via connector 606. Trench 506 and trench 508 are also depicted. Portions of an erase block 518 and 526 extend to either side of the portion shown.

For ease of reference, drain side select layers SGD0, SGD1, SGD2, and SGD3; source side select layers SGS0, SGS1, SGS2, and SGS3; dummy word line layers DWLL1 a, DWLL1 b, DWLL2 a, and DWLL2 b; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten, or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from SiO2. In other embodiments, other dielectric materials may be used to form the dielectric layers.

The non-volatile memory cells are formed along vertical columns (also referred to as channels) which extend through alternating conductive and dielectric layers in the stack. In one embodiment, the memory cells are arranged in NAND strings. The word line layers WLL0-WLL47 connect to storage cells (also called storage cells, memory cells, or data memory cells). Dummy word line layers DWLL1 a, DWLL1 b, DWLL2 a, and DWLL2 b connect to dummy storage cells. A dummy storage cell does not store user data, while a data storage cell is eligible to store user data. Drain side select layers SGD0, SGD1, SGD2, and SGD3 are used to electrically connect and disconnect NAND strings from bit lines. Source side select layers SGS0, SGS1, SGS2, and SGS3 are used to electrically connect and disconnect NAND strings from the source line 316 SL. The memory array 700 shown is illustrated in more detail in FIG. 7.

FIG. 7 illustrates a cross-sectional view of a memory array 700. In one embodiment, the vertical column 522 is round and includes four layers; however, in other embodiments more or less than four layers can be included and other shapes can be used (e.g., a "U" shape instead of an "I" shape or the like). In one embodiment, a vertical column 522 includes an inner core layer 702 that is made of a dielectric, such as SiO2. Other materials can also be used. Surrounding the inner core layer 702 is a polysilicon channel 704. Materials other than polysilicon can also be used. Note that it is the channel 704 that connects to the bit line. Surrounding the channel 704 is a tunneling dielectric 706. In one embodiment, tunneling dielectric 706 has an ONO structure. Surrounding the tunneling dielectric 706 is a shared charge trapping layer 708, such as (for example) Silicon Nitride. Other materials and structures can also be used. The technology described herein is not limited to any particular material or structure.

FIG. 7 depicts dielectric layers DL49, DL50, DL51, DL52, and DL53, as well as word line layers WLL43, WLL44, WLL45, WLL46, and WLL47. Each of the word line layers includes a word line region 710 surrounded by an aluminum oxide layer 712, which is surrounded by a blocking oxide layer 714, which may be of SiO2. The physical interaction of the word line layers with the vertical column forms the storage cell (also referred to as a memory cell). Thus, a storage cell, in one embodiment, comprises channel 704, tunneling dielectric 706, charge trapping layer 708 (e.g., shared with other storage cells), blocking oxide layer 714, aluminum oxide layer 712 and word line region 710. In some embodiments, the blocking oxide layer 714 and aluminum oxide layer 712, may be replaced by a single layer of material with insulating properties or by more than 2 layers of different material with insulating properties. Furthermore, the materials used are not limited to silicon dioxide (SiO2) or aluminum oxide.

For example, word line layer WLL47 and a portion of vertical column 522 comprise a storage cell MC1. Word line layer WLL46 and a portion of vertical column 522 comprise a storage cell MC2. Word line layer WLL45 and a portion of vertical column 522 comprise a storage cell MC3. Word line layer WLL44 and a portion of vertical column 522 comprise a storage cell MC4. Word line layer WLL43 and a portion of vertical column 522 comprise a storage cell MC5. In other architectures, a storage cell may have a different structure; however, the storage cell would still be the data storage unit.

When a storage cell is programmed, electrons are stored in a portion of the charge trapping layer 708 which is associated with the storage cell. These electrons are drawn into the charge trapping layer 708 from the channel 704 through the tunneling dielectric 706, in response to an appropriate voltage on word line region 710. The threshold voltage (Vth) of a storage cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Storage cells in the same location or position in different memory structures (e.g., different NAND strings) on different bit lines, in certain embodiments, may be on the same word line. Each word line may store one page of data, such as when 1-bit of data is stored per single-level cell (SLC); two pages of data, such as when 2-bits of data are stored per multi-level cell (MLC); three pages of data, such as when 3-bits of data are stored per triple-level cell (TLC); four pages of data, such as when 4-bits of data are stored per quad-level cell (QLC); or another number of pages of data.

In the depicted embodiment, a vertical, 3D NAND flash memory structure comprises an "I" shaped memory structure. In other embodiments, a vertical, 3D NAND flash memory structure may comprise a "U" shaped structure, or may have another vertical and/or stacked architecture. In certain embodiments, four sets of strings (e.g., four sets of 48 word lines, or another predefined number of word lines) may form an erase block, while in other embodiments, fewer or more than four sets of strings may form an erase block. As may be appreciated, any suitable number of storage cells may be part of a single NAND string. In one embodiment, a NAND string includes 48 storage cells.

Figure 8:
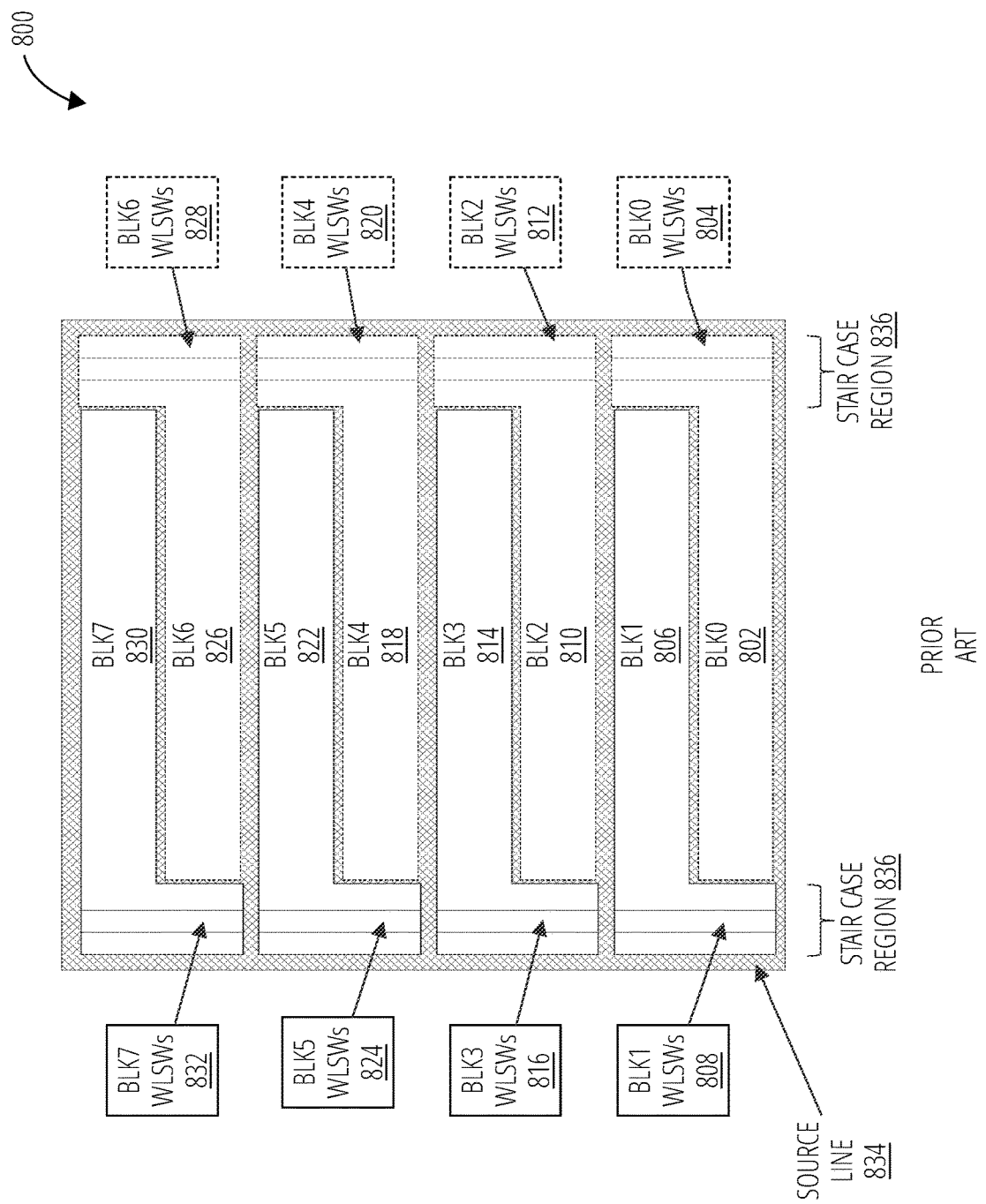
FIG. 8 illustrates a word lines driven from one side 800 in accordance with the prior art.

FIG. 8 shows word lines driven from one side 800 in accordance with the prior art. Eight erase blocks of memory are shown: BLK0 802, BLK1 806, BLK2 810, BLK3 814, BLK4 818, BLK5 822, BLK6 826, and BLK7 830. Note that these numbers are used solely for labeling purposes, and are not intended to represent an exact physical location within a memory array. These erase blocks may be configured as described in FIG. 5-FIG. 7.

As used herein, an "erase block" comprises a set of storage cells organized within a memory array such that an erase storage operation impacts each of the storage cells within the erase block. Ideally, each storage cell of the erase block transitions to an erased state due to the erase storage operation. In practice, certain storage cells may not transition to an erased state and therefore are in an error state due to not erasing properly. An erase block comprises the smallest set of storage cells that can be erased during a single erase storage operation.

A single conductive layer may underlie all of the erase blocks and provide a common source line 834. This corresponds to the source line 402 shown in FIG. 4. To the left and the right side of each erase block, as this drawing is oriented, a stair case region 836 may exist. The stair case region 836 is shown in more detail in FIG. 12. In this region 836, connections may be made between word line layers and high voltage word line switches which are connected of one or more voltage sources, referred to herein as drivers. The gates used to drive memory command signals and to switch those signals to specific locations in memory may, at least in part, reside in, and connect through, the stair case region 836.

Word lines are conventionally driven from only one side because of the area required for the row decoder logic illustrated in FIG. 2. (e.g., row decoder A 218 and row decoder B 220) In a conventional architecture for the memory array, the silicon area needed for the row decoders to drive each word line from both sides would need to be twice the conventional area used for row decoders that drive each word line from only one side.

In a conventional memory array, the row decoders on either side of the memory array are configured to drive half of the word lines and/or erase blocks. In order to accommodate the logic and connections needed for each block, a conventional die layout alternates which sets of high voltage word line switches of the stair case region 836 adjacent to an erase block will connect to and drive the word lines within the erase block.

This alternating connection pattern is illustrated in FIG. 8 using solid and dotted lines to show which stair case region comprising the word line switches (WLSWs) that control each erase block. Starting at the bottom, BLK0 802 is controlled and/or driven by the BLK0 WLSWs 804 located to the right, while BLK1 806 is controlled and/or driven by the BLK1 WLSWs 808 to the left. BLK2 810 is controlled and/or driven by BLK2 WLSWs 812 to the right, and BLK3 814 is controlled and/or driven by BLK3 WLSWs 816 to the left. BLK4 818 is controlled and/or driven by BLK4 WLSWs 820, BLK5 822 by BLK5 WLSWs 824, BLK6 826 by BLK6 WLSWs 828, and BLK7 830 by BLK7 WLSWs 832.

Note that in this configuration, signals (e.g. Voltage and/or Current) that the WLSWs pass to the coupled word lines propagate down the entire length of the word line layer to reach all storage cells constructed around vertical columns along the word line including storage cells at the opposite end from the WLSWs. This worst-case latency may result in reduced performance that does not meet current demands for non-volatile memory media 120.

Figure 9:
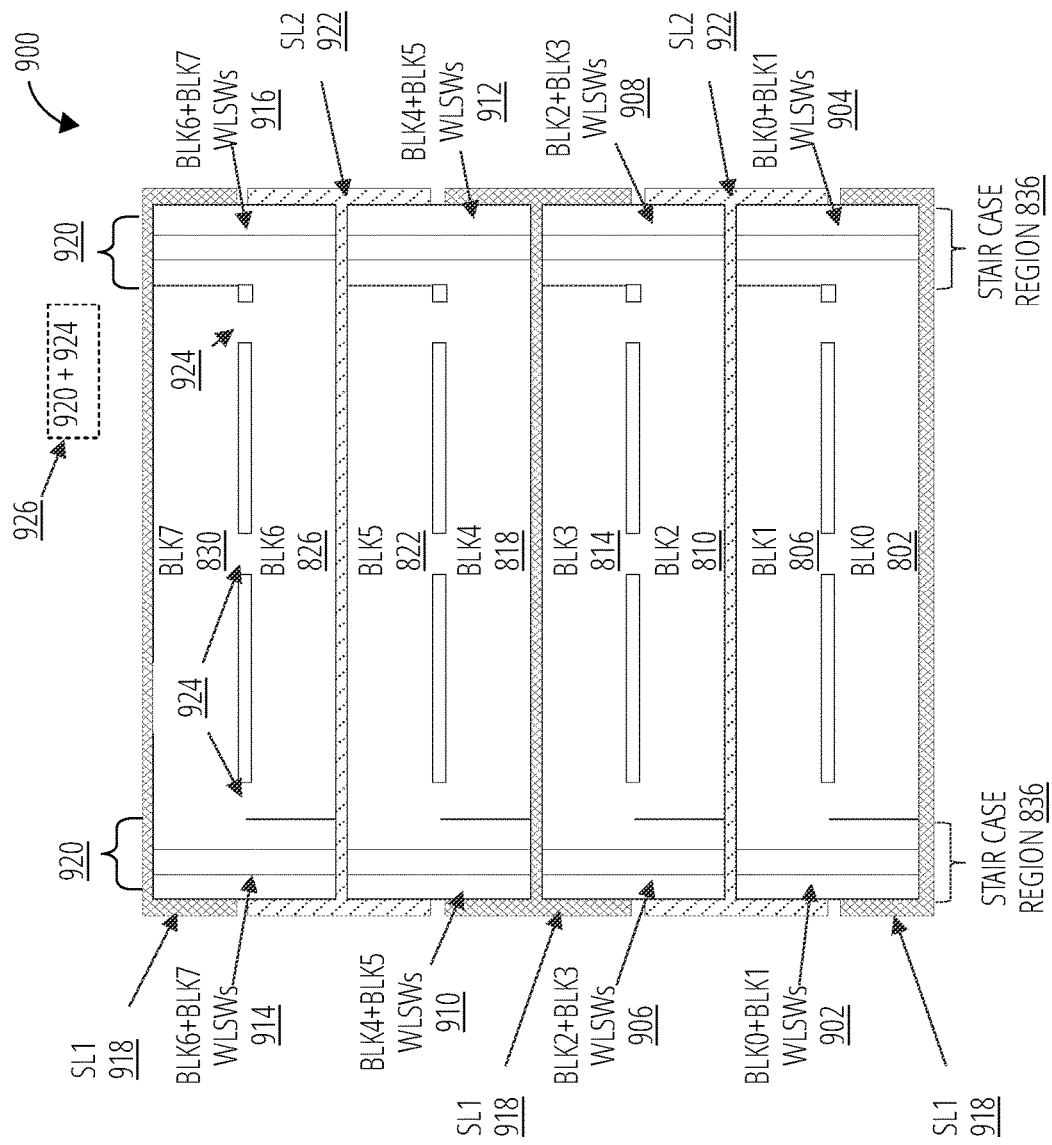
FIG. 9 illustrates a memory array 900 in accordance with one embodiment.

FIG. 9 illustrates a top down view of a memory array 900 in accordance with one embodiment. Certain details are not illustrated (e.g., bit lines and vertical columns) for clarity in illustrating other elements.

The memory array 900 includes a three-dimensional array of storage cells organized into rows and columns. The rows comprise a plurality of word lines and the columns connect to bit lines. The word lines are organized into erase blocks BLK0 802, BLK1 806, BLK2 810, BLK3 814, BLK4 818, BLK5 822, BLK6 826, and BLK7 830.

Storage cells within the memory array connect to the die controller 206 by way of row decoder A 218, row decoder B 220, column decoder A 226, and column decoder B 228. The die controller 206 supplies voltages and/or currents to circuits and logic of the decoders to implement storage operations such as reading storage cells, writing storage cells, and/or erasing storage cells.

In particular, the row decoders and/or column decoders include logic, such as switches, for selectively connecting the storage cells to a voltage driver such as, voltage driver 234 (See FIG. 2). In one embodiment, the memory array includes a connection circuit. A connection circuit is any electrical circuit configured to electrically couple one or more circuit drivers (voltage and/or current) to two ends of a word line. In certain embodiments, a connection circuit includes one or more gates or switches to enable either selective coupling, or substantially simultaneous coupling, of certain components to the driver(s). The connection circuit provides an electrical conductive path that includes one or more word lines in a first set of word lines, one or more word lines in a second set of word lines and a common driver, such as voltage driver 234.

In certain embodiments, the connection circuit includes a plurality of switches (e.g., 902, 904, 906, 908, 910, 912, 914, 916) positioned in the stair case region 836. The switches selectively connect each word line of an erase block to the voltage driver 234. In one embodiment, the switch is a transistor with one terminal in electrical communication to a word line and the other terminal in electrical communication with the voltage driver 234 and the gate in electrical communication with the die controller 206 (e.g., state machine 208).

In the embodiment illustrated in FIG. 9, the connection circuit 926 electrically connects a first word line in one erase block, (e.g., BLK0 802) and a second word line in an adjacent erase block, (e.g., BLK1 806) to the same voltage driver 234. In certain embodiments, the connection circuit 926 includes circuits, logic, or the like, to enable the state machine 208 to activate a switch positioned on one side of the erase block (e.g., BLK0 802) and to substantially simultaneously activate a switch positioned on an opposite end of the erase block (e.g., BLK1 806). In this manner, the state machine 208, voltage driver 234, and connection circuit 926 work together to supply a voltage signal (e.g., bias) to both the second word line and the first word line from both ends at substantially the same time.

As used herein, an adjacent erase block comprises an erase block positioned next to or in close proximity to an existing erase block, with no other erase blocks between them. In the embodiment illustrated in FIG. 9, BLK0 802 and BLK1 806 are representative examples of adjacent erase blocks. Conversely, BLK0 802 and BLK2 810 are not adjacent erase blocks because BLK1 806 is positioned between them.

As mentioned above, analog circuits, such as those of the word lines, experience resistive-capacitive (RC) loading when a voltage is applied. As explained in relation to FIG.

3, voltage applied to the word line is applied to the gate of the storage cells along the word line to bias a storage cell for a storage operation.

A memory array 900 configured with the state machine 208, voltage driver 234 (see FIG. 2), and connection circuit 926 adjusts a voltage signal (e.g., bias) on the second word line and the first word line from both ends at substantially the same time which mitigates delay caused by RC loading. FIG. 8 illustrates an embodiment from a top view, consequently, details of connections between one word line in a selected erase block, such as BLK0 802 and another word line in an unselected erase block, such as word line layers and/or connection circuits of the memory array that are below this top level view are not shown here for clarity. However, these details are included in subsequent figures of other embodiments. It should be noted that in the embodiments described herein, each word line within a selected erase block of a three-dimensional array is coupled to a corresponding word line in an adjacent erase block of the three-dimensional array.

In order to reduce the latency incurred in propagating a signal across the entire length of a word line, the apparatus disclosed herein uses the WLSWs (of the connection circuit) on both sides of a pair of adjacent erase blocks to drive signals onto word line layers from both ends. Thus, the worst case latency is incurred at the middle of the word line layer, and is much less than the latency incurred through propagating a signal from one end to the other.

As illustrated, in the depicted embodiment, WLSWs located in both stair case regions are used to drive the even and odd adjacent erase blocks. BLK0+BLK1 WLSWs 902 and BLK0+BLK1 WLSWs 904 both drive BLK0 802 as well as BLK1 806. BLK2+BLK3 WLSWs 906 and BLK2+BLK3 WLSWs 908 drive BLK2 810 and BLK3 814. BLK4+BLK5 WLSWs 910 and BLK4+BLK5 WLSWs 912 drive BLK4 818 and BLK5 822. BLK6+BLK7 WLSWs 914 and BLK6+BLK7 WLSWs 916 drive BLK6 826 and BLK7 830.

Additionally, using switches on both sides to drive both erase blocks, rather than alternating driving gates for a single erase block from one side to the other, reduces the RC delay and propagation latency, without increasing the row decoder (e.g., row decoder A 218, row decoder B 220) layout area.

Generally, the word lines of the memory array 900 experience voltages ranging from about 0 volts to about 20 volts. In embodiments in which the connection circuit 926 includes switches that connect both sides of one or more word lines to a common driver 1016 and the switches comprise transistors, the transistors are large in comparison to other CMOS components of the memory array 900. Consequently, word line switches for one erase block may occupy space vertically aligned with word lines of an adjacent erase block as well as space vertically aligned with word lines of a particular erase block. (For example, in FIG. 9, switches of BLK0+BLK1 WLSWs 904 connect to both BLK0 802 and BLK1 806 using the same area that prior designs used to connect to a single erase block.)

In one embodiment, the connection circuit 926 includes both one or more external conductive links 920 and one or more internal conductive links 924. External conductive links 920 are electrical components external to (outside the perimeter of) a memory array that are configured to conduct, or pass, a voltage or current between two word lines of the memory array and voltage driver 234. Examples of external conductive links 920 and/or components that may comprise one or more external conductive links 920, include, but are not limited to, wires, leads, traces, metal lines, resistors, conductors, capacitors, inductors, switches, and the like.

Internal conductive links 924 are electrical components internal to (within the perimeter of) a memory array that are configured to conduct, or pass, a voltage or current between two word lines of the memory array and voltage driver 234. Examples of internal conductive links 924 and/or components that may comprise one or more internal conductive links 924, include, but are not limited to, wires, leads, traces, metal lines, resistors, conductors, capacitors, inductors, switches, and the like. In one embodiment, the connection circuit includes just external conductive links 920 and no internal conductive links 924.

Note that in FIG. 8 the word line layers within the die are split by way of trench to separate adjacent erase blocks. In the disclosed apparatus, one word line in either erase block is driven by a common driver that also drives a word line at the same layer of the memory array in the other erase block, so this separation is not necessary. Consequently, adjacent erase blocks may be operated as a single erase block that is double in size versus embodiments that include trench. Embodiments, having a larger erase block size may be used for products having a more limited capacity but optimized to store large sets of contiguous data for fast read access.

In certain embodiments, smaller erase blocks are desirable. In such embodiments, a connection circuit couples each word line of the memory array with a word line in an adjacent erase block. Connections may be made between adjacent erase blocks, by way of the connection circuit. This is described in more detail in FIG. 12. However, in order to implement this solution without doubling the erase block size, two source lines are used instead of the single common source line 834 shown in FIG. 8. The first source line 918 is used for BLK0 802, BLK3 814, BLK4 818, and BLK7 830. The second source line 922 is used for BLK1 806, BLK2 810, BLK5 822, and BLK6 826. Separation of the word line layers between the adjacent erase blocks that share a source line is maintained. This allows a simplified layout while still providing a unique source line connection for blocks sharing word line switching logic.

As used herein, a "selected" component refers to a component that a command, instruction, or controller, such as a die controller 206 or storage controller 216 is targeting/addressing/selecting for a particular operation. Examples of such references include selected storage cell, selected page of storage cells, selected word line, selected erase block, selected plane, selected memory die, and the like. As used herein, an "unselected" component refers to a component that a command, instruction, or controller, such as a die controller 206 or storage controller 216 is not targeting/addressing/selecting for a particular operation. Examples of such references include unselected storage cell, unselected page of storage cells, unselected word line, unselected erase block, unselected plane, unselected memory die, and the like. The operation may comprise an internal testing or maintenance operation (e.g., garbage collection, test mode operation), a user command/request, or a particular storage operation such as a read operation, write operation, or erase operation. Due to various semiconductor architectures and configurations, like components may be connected, coupled, or otherwise associated with each other, in such a way that an operation on a selected component adversely impacts the unselected component. For example, in a read operation of a storage cell of a NAND string, unselected storage cells along the NAND string are turned on, activated, such that a programmed state of a selected storage cell can be sensed. During the read operation, activating the unselected storage cells along the NAND string may unintentionally change a threshold voltage of certain unselected storage cells along the NAND string. This unintended change is known as a 'disturb' or 'interference'. In order to perform a desired operation voltage signals or a bias at one level may be sent to selected components, while different magnitude voltage signals are sent to unselected components.

Figure 10:
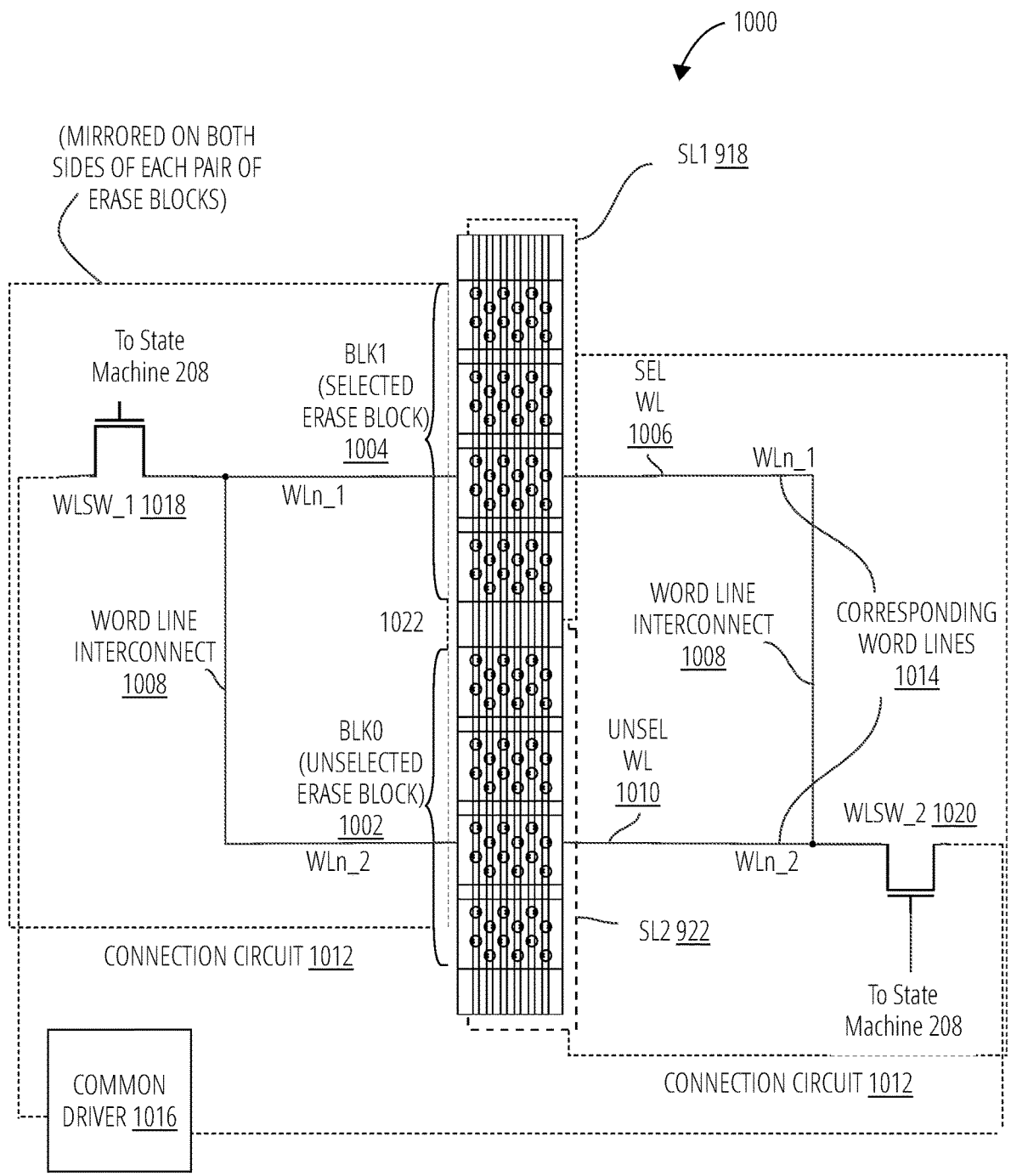
FIG. 10 illustrates memory array 1000 in accordance with one embodiment.

FIG. 10 is a top down view of a memory array 1000 in accordance with one embodiment. A portion of a memory array 1000 is visible, similar to FIG. 5. As described in FIG. 9, a dual and/or split source line is implemented. The first source line 918 underlies the BLK1 (selected erase block) 1004, and the second source line 922 underlies the BLK0 (unselected erase block) 1002. The memory array 1000 includes a BLK1 (selected erase block) 1004 and a BLK0 (unselected erase block) 1002. A BLK1 (selected erase block) 1004 is an erase block that the die controller 206 specifically addresses and/or selects in order to perform an operation. The operation may be directed at the erase block itself or one or more components of the erase block. Correspondingly, a BLK0 (unselected erase block) 1002 is an erase block that the die controller 206 specifically does not address and/or select for an operation. A selected word line 1006 is a word line that the state machine 208 specifically addresses within the BLK1 (selected erase block) 1004 for a particular operation such as a read operation or a write operation. An unselected word line 1010 is a word line that the state machine 208 specifically does not address and/or select within the BLK0 (unselected erase block) 1002, but may experience certain bias voltages or current during a particular operation because of how the unselected word line 1010 is coupled to the selected word line 1006.

FIG. 10 illustrates details of one embodiment of a connection circuit 1012. Specifically, FIG. 10 illustrates details of external conductive links 920 of a connection circuit 1012. The connection circuit 1012 includes components on both sides (left and right in the FIG. 10) of the memory array 1000 (e.g., in the area of row decoder A 218 and row decoder B 220).

The connection circuit 1012 includes a first word line switch 1018. In one embodiment, the first word line switch is a transistor sized to control flow of a voltage supplied to the switch of between about 0 volts and 25 volts. In one embodiment, the gate terminal of the first word line switch 1018 is coupled to the state machine 208 such that a voltage supplied by the state machine 208, at a sufficient voltage level, activates the first word line switch 1018 to supply voltage to, or drain voltage from, a selected word line 1006.

The connection circuit 1012 includes a second word line switch 1020. In one embodiment, the second word line switch is a transistor sized to control flow of a voltage supplied to the switch of between about 0 volts and 25 volts. The gate terminal of the second word line switch 1020 is coupled to the state machine 208 such that a voltage supplied by the state machine 208, at a sufficient voltage level, activates the second word line switch 1020 to supply voltage to, or drain voltage from, an unselected word line 1010.

The connection circuit 1012 also includes a word line interconnect 1008 on both sides (left and right in the FIG. 10). The word line interconnect 1008 on each side electrically couples the selected word line 1006 to an unselected word line 1010 of a BLK0 (unselected erase block) 1002. In certain embodiments, the selected word line 1006 and unselected word line 1010 are in the same layer of a three-dimensional array comprising a plurality of layers that form the memory array 1000. Word lines in the same layer of the three-dimensional array are referred to herein as corresponding word lines 1014. In another embodiment, the selected word line 1006 and unselected word line 1010 are on different layers of the three-dimensional array, even so, the selected word line 1006 and unselected word line 1010 are corresponding word lines. As used herein, a corresponding word line is any word line coupled to another word line of another erase block in the memory array. In certain embodiments, both word lines are in the same layer of the three-dimensional array. In other embodiments, each word line is on a different layer of the three-dimensional array.

In the illustrated embodiment, the word line interconnect 1008 electrically couples the selected word line 1006 and unselected word line 1010 even though the trench 1022 divides the selected word line 1006 and unselected word line 1010 within the memory array. In other words, in one embodiment, the word line interconnect 1008 provides an electrical connection for two word lines at the same layer in the three-dimensional array across a void, or opening, formed by the trench 1022. In certain embodiments, the word line interconnect 1008 is made of conductive lines within metal layers of the stair case region 836. In other embodiments, the word line interconnect 1008 is a trace that spans the trench 1022.

The connection circuit 1012 on each side of the memory array together with a signal from the state machine 208 to activate the first word line switch 1018 and second word line switch 1020 at substantially the same time supplies, or drains, a voltage on the selected word line 1006 and unselected word line 1010 from both ends of the word lines. The voltage is driven or drained by the common driver 1016. Consequently, RC delay that is inherently due to a selected word line 1006 is mitigated.

FIG. 10 illustrates a BLK1 (selected erase block) 1004 and a BLK0 (unselected erase block) 1002. These erase blocks 1004, 1002 are adjacent erase blocks. In certain embodiments, adjacent erase blocks are separated by a trench 1022.

Corresponding word lines 1014 WLn 1 and WLn 2 are shown as wires in an electrical schematic, but may be understood to be conductive layers within the stack comprising each block, as illustrated in FIG. 6. A first word line switch 1018 and second word line switch 1020 on either side of the pair of erase blocks may operate substantially simultaneously to drive control signal voltage levels to accomplish read, program, and erase operations delivering the voltage to both ends of the connected word line layers, as described below.

Read Operations

For a read operation on the disclosed memory apparatus, the WLSWs are shared between adjacent erase blocks as shown. The state machine 208 turns off all drain select gates, as shown in FIG. 4, for the BLK0 (unselected erase block) 1002. The state machine 208, by way of the common driver 1016, applies a read voltage ($V_{Read}$) to a selected word line 1006, because of the connection circuit 1012 and the second word line switch 1020 the unselected word line 1010 also experiences a read voltage ($V_{Read}$) from both ends. Other word lines in the three-dimensional array also include a connection circuit 1012 coupled to a common driver 1016 (this may be the same driver or another driver). These other word lines receive a pass voltage ($V_{CG}$) configured to activate the storage cells for the read sensing operation portion of a read operation. Word line RC loading does not uncontrollably increase because turning off the drain select gates of the BLK0 (unselected erase block) 1002 causes the channels of the NAND strings of the BLK0 (unselected erase block) 1002 to float. Read disturb of storage cells in the BLK0 (unselected erase block) 1002 is limited by boosting phases; a similar approach is taken during program inhibit phases of a program operation. The state machine 208 maintains a common voltage level (CELSRC) on first source line 918 and second source line 922, for the BLK1 (selected erase block) 1004 and BLK0 (unselected erase block) 1002, respectively.

Program Operations

For a program operation on the disclosed memory apparatus, the WLSWs are shared between adjacent erase blocks as shown. The state machine 208 turns off all drain select gates, as shown in FIG. 4, for the BLK0 (unselected erase block) 1002. The state machine 208, by way of the common driver 1016 applies a programming voltage ($V_{Pgm}$) to a selected word line 1006, because of the connection circuit 1012 and the second word line switch 1020 the unselected word line 1010 also experiences a programming voltage ($V_{Pgm}$) from both ends.

Other word lines in the three-dimensional array also include a connection circuit 1012 coupled to a common driver 1016 (this may be the same driver or another driver). These other word lines receive a pass voltage ($V_{Pass}$) configured to activate the storage cells to supply electrons for the programming operation. Word line RC loading does not uncontrollably increase because turning off the drain select gates of the BLK0 (unselected erase block) 1002 causes the channels of the NAND strings of the BLK0 (unselected erase block) 1002 to float. The state machine 208 maintains a common voltage level (CELSRC) on first source line 918 and second source line 922, for the BLK1 (selected erase block) 1004 and BLK0 (unselected erase block) 1002, respectively.

Erase Operations

In an erase operation all word lines of an erase block are erased together in a single operation. For an erase operation on the disclosed memory array 1000, the first word line switch 1018 and second word line switch 1020 are shared between adjacent erase block as shown. Word lines on both the BLK1 (selected erase block) 1004 and the BLK0 (unselected erase block) 1002, are biased from both sides to ground or a voltage level substantially zero ($V_{SS}$). The state machine 208 prevents erasure of the BLK0 (unselected erase block) 1002 by maintaining a voltage level on the second source line 922 lower than the voltage on the first source line 918 ($V_{ERA}$). In one embodiment a separate first source line 918 and second source line 922 are implemented to maintain an erase block size for the disclosed memory array 1000 as is seen in conventional memory architectures. If the erase block size is not a concern for a particular implementation, a single source line may still be implemented. Hole injection into the channel 704 of the NAND string may be done from the source side of the NAND string, with no need to bias the bit lines to $V_{ERA}$.

Figure 11:
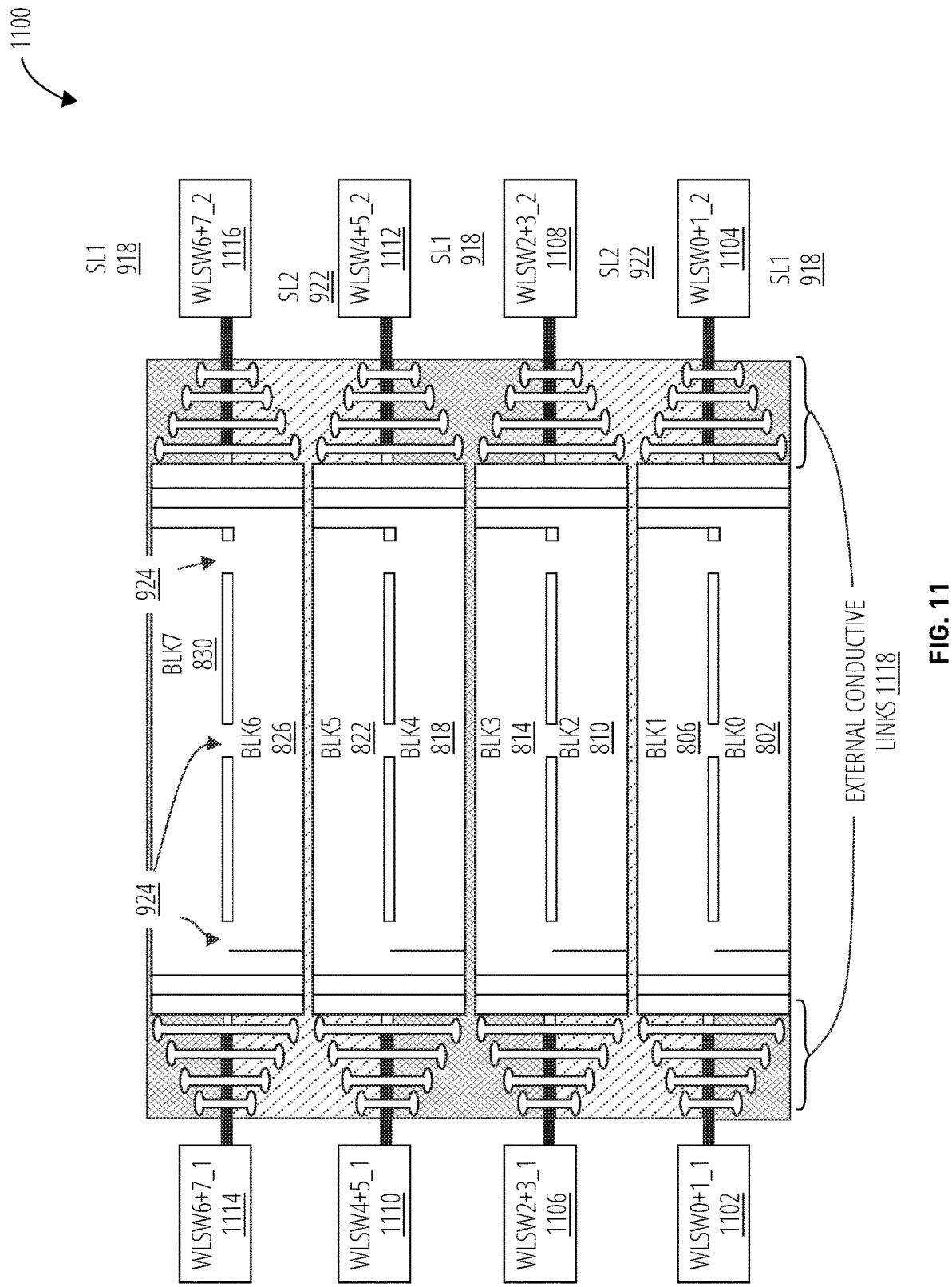
FIG. 11 illustrates memory array 1100 in accordance with one embodiment.

FIG. 11 illustrates a memory array 1100 in accordance with one embodiment. Eight erase blocks are shown, as in FIG. 9, with adjacent erase blocks paired and driven by one or more common drivers (not shown in FIG. 11) on both ends of the word line layers. Two source line planes 918, 926, sit below the three-dimensional array such that paired adjacent erase blocks (e.g., BLK0 802, BLK1 806) operate using different source lines, so that the size of the erase block may remain the same size as that used in conventional memory architectures.

Shared word line switches (1102, 1104, 1106, 1108, 1110, 1112, 1114, 116) may connect to the word line layers of adjacent erase blocks through external conductive links 1118 as shown. This is illustrated in more detail in FIG. 12. BLK0 802 and BLK1 806 are each driven from both sides simultaneously by WLSW0+1_1 1102 and WLSW0+1_2 1104. These switches may be arranged as the first word line switch 1018 and second word line switch 1020 shown in FIG. 10. While BLK0 802 operates using first source line 918, BLK1 806 operates using of second source line 922, as shown. BLK2 810 and BLK3 814 are driven from both sides by the common drivers WLSW2+3_1 1106 and WLSW2+3_2 1108. BLK2 810 shares a section of second source line 922 with BLK1 806, while BLK3 814 operates using the first source line 918. BLK4 818 and BLK5 822 are both driven by WLSW4+5_1 1110 and WLSW4+5_2 1112, and BLK6 826 and BLK7 830 share the common drivers WLSW6+7_1 1114 and WLSW6+7_2 1116. The even blocks (as labeled in this figure) operate using the first source line 918, and the odd blocks use second source line 922.

FIG. 11 illustrates one embodiment of the external conductive links 1118. Typically, each word line of each adjacent erase block connects to a word line switch on each side of the three-dimensional array. In certain embodiments a stair case region 836 is formed on each end of the three-dimensional array. Each step on the stair case corresponds to a layer in the three-dimensional array. At each step, a connection is made for one word line in a first erase block (BLK0 802). The connection also connects to a word line interconnect. The word line interconnect spans the trench and makes another connection to another word line in a second erase block (BLK1 806). In order to avoid interfering with word line interconnects on different layers the word line interconnect, with its connections, may take the shape of dumb bells.

Figure 12:
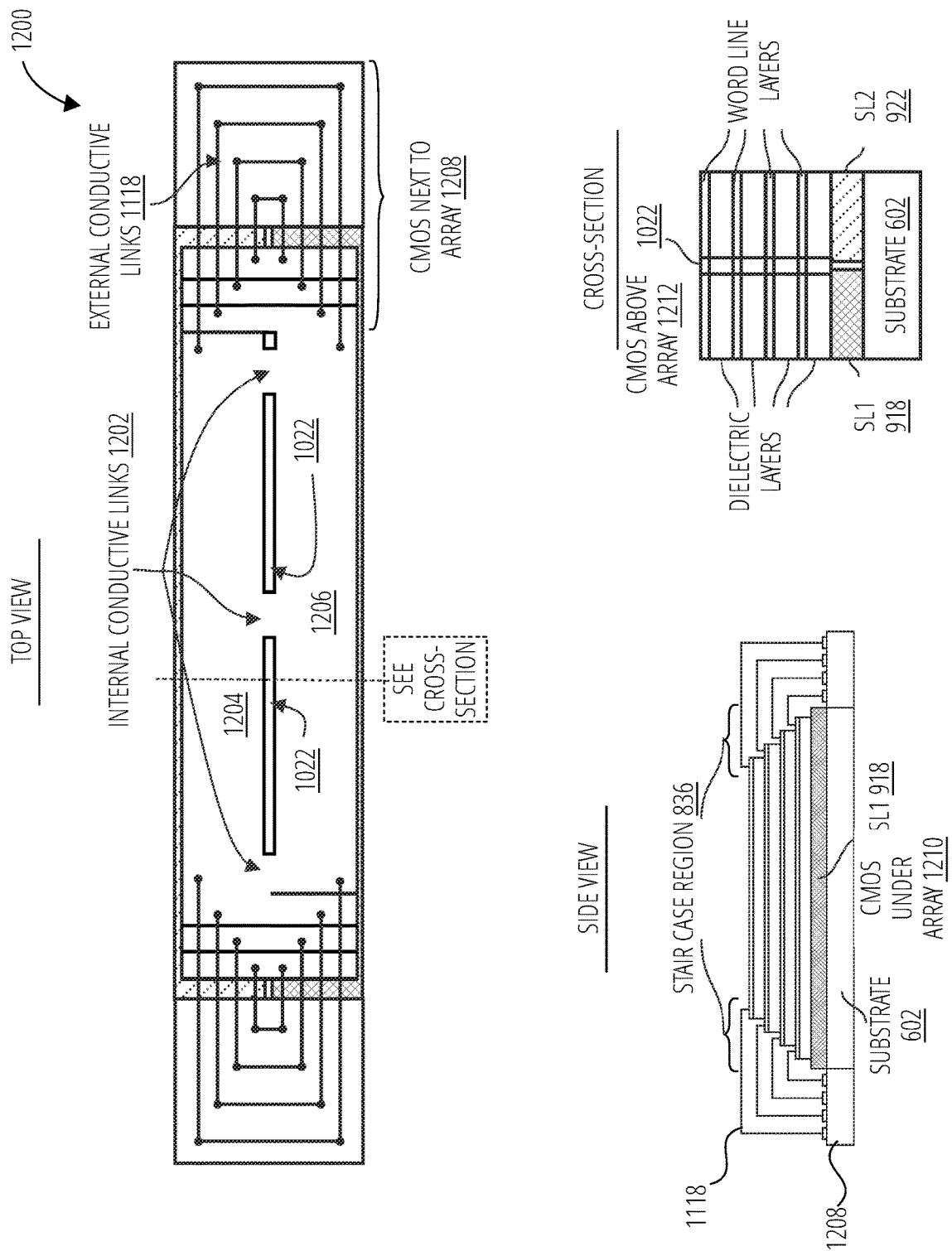
FIG. 12 illustrates connections between adjacent erase blocks 1200 in accordance with one embodiment.

FIG. 12 illustrates connections between adjacent erase blocks 1200 in accordance with one embodiment. A top view of a pair of adjacent erase blocks is shown, similar to previous illustrations.

A first erase block 1206 includes a first set of word lines. The first erase block 1206 is positioned adjacent to a second erase block 1204 that includes a second set of word lines, as shown. The first erase block 1206 is connected to a first source line 918, while the second erase block 1204 is connected to a second source line 922. Each word line within the first set of word lines may be connected to the corresponding word line in the second set of word lines by various means to achieve the configuration disclosed herein.

FIG. 12 illustrates external conductive links 1118 connecting corresponding word lines. The external conductive links 1118 may be embodied as circuitry implemented in CMOS next to array 1208 (CNA). CMOS next to array 1208 is a configuration of on-die logic that resides in a region next to, and coplanar with, the memory array layers of the three-dimensional array. A simplified version of this is shown. In addition to the memory array layers and the stair case region 836 on both sides of the array, additional regions, 1210, 1212, are shown to illustrate how gating and driving logic may be implemented within a memory die. In certain embodiments, the CMOS circuits and components of the connection circuit such as external conductive links are positioned in an area above the three-dimensional array, (e.g., CMOS Above Array 1212 (CAA)). In certain embodiments, the CMOS circuits and components of the connection circuit such as external conductive links are positioned in an area below the three-dimensional array, (e.g., CMOS Under Array 1210 (CUA)).

Each of the external conductive links 1118 shown represents an example of the word line interconnect 1008 illustrated schematically in FIG. 10. While not illustrated in FIG. 12, the external conductive links 1118 connect to word line switches on either side of the three-dimensional array. The WLSWs shown in FIG. 10 may be embodied as transistor gates within the CMOS next to array 1208 on both side of the word line layers.

As illustrated in FIG. 8 side view and top view, each erase block operates using separate source lines, constructed as conductive planes between a substrate 602 and the memory array layers. Adjacent erase blocks are separated along trench 1022, which may be implemented in the form of an opening or void, completely disconnecting the conductive layers that form corresponding word lines in adjacent erase blocks. The trench 1022 may be filled with SiO2 or a similar material and may also be used for other circuitry routing.

In certain embodiments of the memory apparatus disclosed herein, corresponding word lines may be electrically connected through external conductive links 1118 as discussed above, in order to share one or more common drivers with minimal impact to logic layout within the CMOS next to array 1208. Such a connection to both sides of the word line layers, rather than driving signals onto one side of a word line layer improves performance time by reducing the RC loading, as discussed above.

With such high speed signal transmission, the resistance and capacitance inherent in the physical memory structure may have an observable impact on signal time. These resistive-capacitive (RC) effects may be tuned for particular implementations by bridging the trench 1022 through internal conductive links 1202 spanning the trench 1022, using different kinds of external conductive links 1118, or the like. Three internal conductive links 1202 are illustrated in this embodiment, but the number of internal conductive links 1202 may vary based on array design. Similar, the width and position of the internal conductive links 1202 may vary based on design and implementation requirements.

It should be noted that certain embodiments may include just internal conductive links, certain embodiments may include just external conductive links. Other embodiments, such as three-dimensional array 1200, include both internal conductive links 1202 and external conductive links 1118.

Internal conductive links 1202 may be implemented as regions, within a word line layer spans a trench 1022 allowing a physical connection between corresponding word line layers. This may be implemented as a trace that spans the trench between adjacent erase blocks. Such internal conductive links 1202 lower the resistance encountered by a signal traveling across a word line layer, which enables faster signal transmission.

However, as shown in the cross-section view in FIG. 12, word line layers are implemented as conductive planes separated by dielectric layers. This construction results in an inherent capacitance, which increases as the internal conductive links 1202 widen. This capacitance may slow signal transmission. Thus the number, dimensions, and positions of internal conductive links 1202 may be adjusted to mitigate the RC effects caused by die construction in order to further improve signaling speed and quality to meet higher performance standards.

In one embodiment, the internal conductive links 1202 are formed during a fabrication process that creates the word line and dielectric layers of the three-dimensional array. Various fabrication methods can be used to build the internal conductive links 1202. In one method, the internal conductive links 1202 are made of the same materials as the word line layers (e.g., tungsten). In one fabrication method, a mask is used to etch openings between the internal conductive links 1202 to form openings for the trench.

Figure 13:
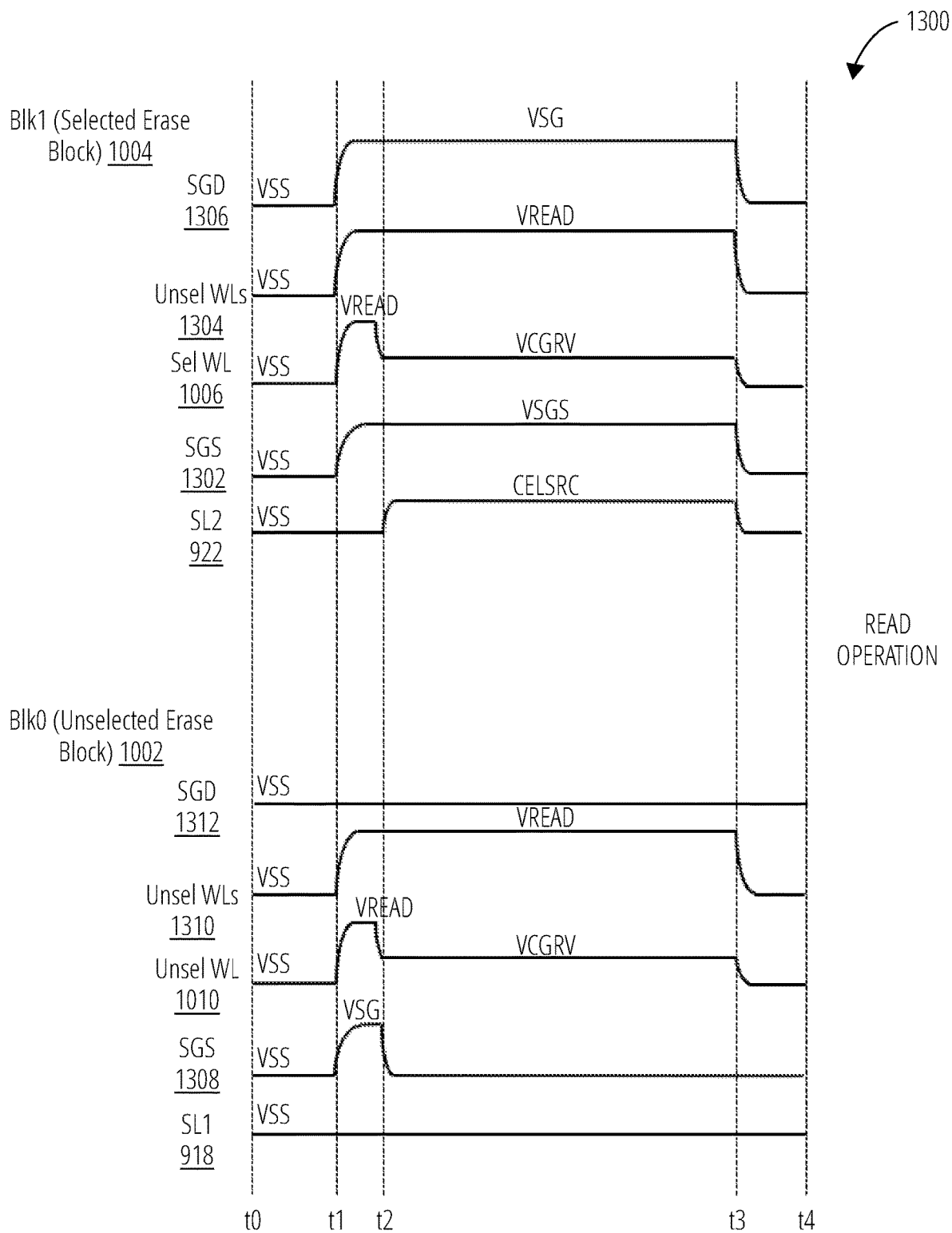
FIG. 13 illustrates waveforms 1300 in accordance with one embodiment.

FIG. 13 illustrates a read operation waveforms 1300 in accordance with one embodiment. The state machine 208 manages control logic to activate and connect voltage drivers and current sources to the different lines, nodes, and signals of the three-dimensional array to implement a read operation. These waveforms illustrate the voltage levels for the nodes, lines, gates or components during different phases of the read operation. Different phases are indicated by time markers (t0, t1, t2, t3, t4).

In FIG. 13, SL2 922 is the signal on the second source line 922 during the read operation. SGS 1302 is the signal on the gate terminal of the source select gate(s) of the NAND strings of the selected erase block during the read operation. Sel WL 1006 is the signal on the selected word line 1006 during the read operation. Unsel WLs 1304 is the signal on the unselected word lines of the selected erase block 1004 during the read operation. Generally, read operations involve the storage cells coupled to the selected word line (also referred to as a page) and the other word lines of a selected erase block may receive a different voltage to effectuate the read operation. Consequently, Unsel WLs 1304 is the signal on each of the unselected word lines of the selected erase block during the read operation. SGD 1306 is the signal on the gate terminal of the drain select gate(s) of the NAND strings of the selected erase block during the read operation.

SL1 918 is the signal on the first source line 918 of the unselected erase block during the read operation. SGS 1308 is the signal on the gate terminal of the source select gate(s) of the NAND strings of the unselected erase block during the read operation. UnSel WL 1010 is the signal on the unselected word line 1010 during the read operation. Unsel WLs 1310 is the signal on the unselected word lines of the unselected erase block during the read operation. SGD 1312 is the signal on the gate terminal of the drain select gate(s) of the NAND strings of the unselected erase block during the read operation.

FIG. 13 illustrates that the waveform for the selected word line 1006 tracks with the waveform for the unselected word line 1010 and the Unsel WLs 1304 waveform tracks with the Unsel WLs 1310. This is because the one or more connection circuits couple each word line in the selected erase block and each word line in the unselected erase block to the common driver (e.g. Common driver 1016). As explained above, the connection circuits enable the state machine 208 to drive, or discharge, each word line from both sides. The state machine 208 is configured to manage other gates and switches such that voltage signals on a selected word line have a mitigated impact (e.g. disturb) on storage cells on unselected word lines (both in the selected erase block and in the unselected erase block).

Voltage levels may fall within the ranges listed below:
VSS—0 Volt
VSG—4~8 Volts
VREAD—4~10 Volts
VCGRV—0~6 Volts
VSGS—0~2 Volts
CELSRC—0.4~2 Volts Timing events for the different phases of a read operation are described as follows:
t0 ⇨ t1: prepare voltage generators
t1 ⇨ t2: During this time period, the state machine 208 discharges the channel (e.g., channel 704) for all storage cells in both BLK1 (selected erase block) 1004 and BLK0 (unselected erase block) 1002. Also during this time period, a voltage pulse is sent on the selected word line 1006. As voltages on word lines are increasing during this time period this is a ramp-up phase (also called a charge up phase). Because the pulse is applied to both sides of selected word line 1006 in the BLK1 (selected erase block) 1004 and unselected word line 1010 in BLK0 (unselected erase block) 1002, the voltage level rises from Vss to Vread at a faster rate, than if selected word line 1006 was only driven from one side. FIG. 13 also illustrates that the voltage level on selected word line 1006 in the BLK1 (selected erase block) 1004 and unselected word line 1010 in BLK0 (unselected erase block) 1002 are substantially the same during the read operation. The state machine 208 mitigates read disturb in BLK0 (unselected erase block) 1002 by turning off the SGD and SL1 of the NAND strings in the BLK0 (unselected erase block) 1002.

t2 ⇨ t3: read/sense storage cells of BLK1 (selected erase block) 1004 on bit lines of the selected word line of the selected erase block.

t3 ⇨ t4: recovery. Voltages are discharged to a lower, or ground, level in preparation for either a subsequent phase of a storage operation, or a separate storage operation. As voltages on the word lines are decreasing during this time period this is referred to as a ramp-down phase (also called a discharge phase). Because the pulse is discharged from both sides of selected word line 1006 in the BLK1 (selected erase block) 1004 and unselected word line 1010 in BLK0 (unselected erase block) 1002, the voltage level decreases at a faster rate than if selected word line 1006 was only driven from one side. FIG. 13 also illustrates that a steep discharge rate is on waveforms Unsel WLs 1304 and Unsel WLs 1310 which are also coupled by a connection circuit to a common driver.

Figure 14:
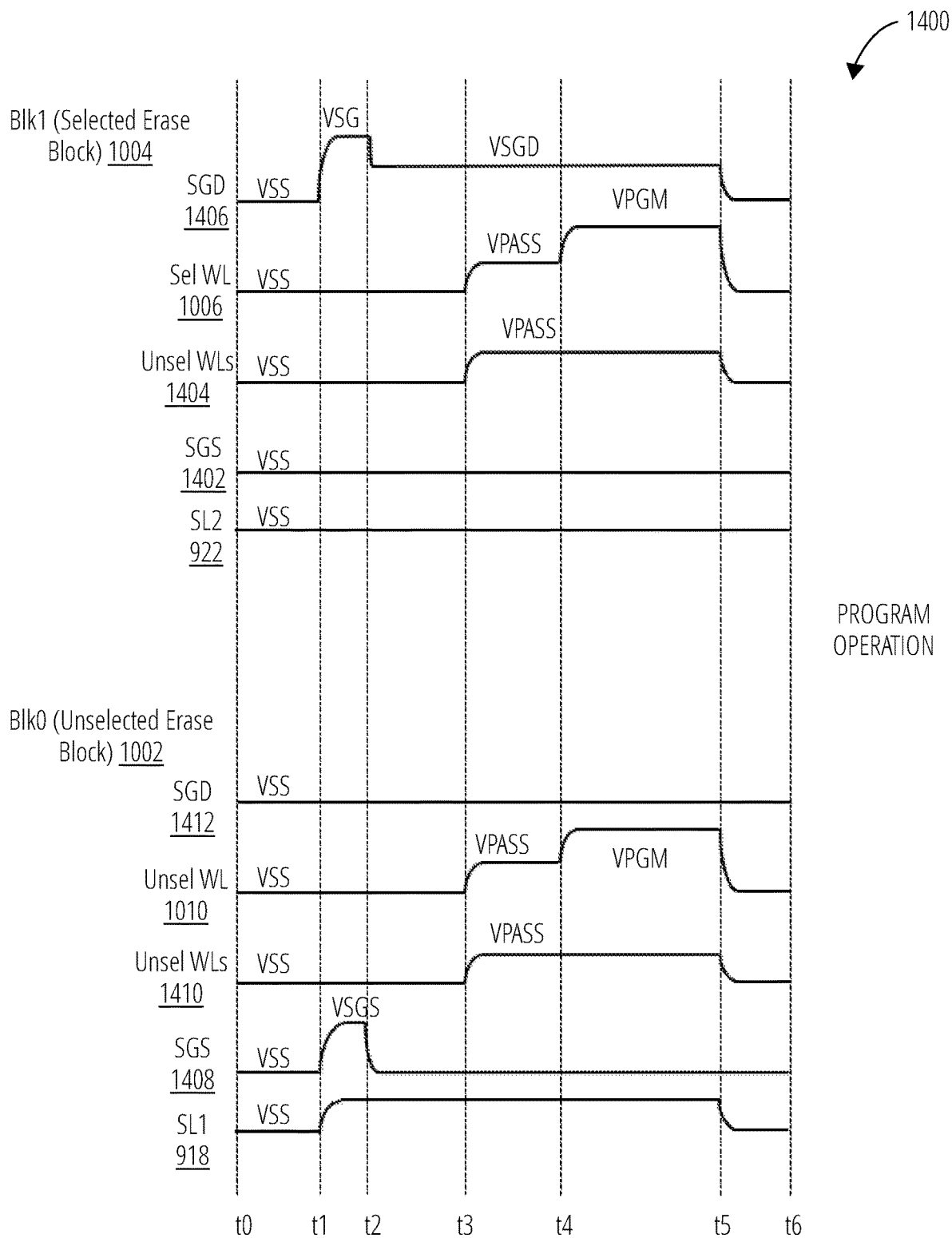
FIG. 14 illustrates waveforms 1400 in accordance with one embodiment.

FIG. 14 illustrates a program and/or write operation waveforms 1400 in accordance with one embodiment. The state machine 208 manages control logic to activate and connect voltage drivers and current sources to the different lines, nodes, and signals of the three-dimensional array to implement the program and/or write operation. In FIG. 14 like numbered signals represent the same nodes, lines, gates and components described in relation to FIG. 13.

Sel WL 1006 is the signal on the selected word line 1006 during the program operation. Unsel WLs 1404 is the signal on the unselected word lines of the selected erase block 1004 during the program operation. Generally, program operations involve the storage cells coupled to the selected word line (also referred to as a page) and the other word lines (e.g. Unsel WLs 1404) of a selected erase block may receive a different voltage to effectuate the program operation. Consequently, Unsel WLs 1404 is the signal on each of the unselected word lines of the selected erase block during the program operation. SGD 1406 is the signal on the gate terminal of the drain select gate(s) of the NAND strings of the selected erase block during the program operation.

SL1 918 is the signal on the first source line 918 of the unselected erase block during the program operation. SGS 1408 is the signal on the gate terminal of the source select gate(s) of the NAND strings of the unselected erase block during the program operation. Unsel WL 1010 is the signal on the unselected word line 1010 during the program operation. Unsel WLs 1410 is the signal on the unselected word lines of the unselected erase block during the program operation. SGD 1412 is the signal on the gate terminal of the drain select gate(s) of the NAND strings of the unselected erase block during the program operation.

FIG. 14 illustrates that the waveform for the selected word line 1006 tracks with the waveform for the unselected word line 1010 and the Unsel WLs 1404 waveform tracks with the Unsel WLs 1410. This is because the one or more connection circuits couple each word line in the selected erase block and each word line in the unselected erase block to the common driver (e.g. Common driver 1016). As explained above, the connection circuits enable the state machine 208 to drive or discharge each word line from both sides. The state machine 208 is configured to manage other gates and switches such that voltage signals on a selected word line have a mitigated impact on storage cells on unselected word lines (both in the selected erase block and in the unselected erase block).

Voltage levels, not listed earlier in relation to FIG. 13, may fall within the ranges listed below:

VPGM—10~25 Volts

VPASS—5~11 Volts

Timing events for the different phases of a program operation are described as follows:

t0 ⇨ t1: prepare voltage generators t1 ⇨ t2: During this time period, the state machine 208 charges/pre-charges the channel (e.g. Channel 704) and bit lines for all storage cells in BLK1 (selected erase block) 1004. The state machine 208 charges/precharges the channel of BLK0 (unselected erase block) 1002 by way of SL1.

t3=>t4: During this time period, the state machine 208 boosts the voltage in NAND strings having storage cells on the selected word line 1006 that are to be inhibited from programming. Because of the connection circuits, all the word lines of the BLK0 (unselected erase block) 1002 also receive the boosting voltage of Vpass.

t3=>t4: The state machine 208 sends a programming voltage pulse (Vpgm) on the selected word line 1006 to program selected storage cells. Because the pulse is applied to both sides of selected word line 1006 in the BLK1 (selected erase block) 1004 and unselected word line 1010 in BLK0 (unselected erase block) 1002, the voltage level rises from Vss to Vread at a faster rate, than if selected word line 1006 was only driven from one side. The state machine 208 mitigates read disturb in BLK0 (unselected erase block) 1002 by turning off the SGD and raising the voltage of the SL1 of the BLK0 (unselected erase block) 1002.

t5 ⇨ t6: recovery. Voltages are discharged to a lower, or ground, level in preparation for either a subsequent phase of a storage operation, or a separate storage operation. Because the pulse is discharged from both sides of selected word line 1006 in the BLK1 (selected erase block) 1004 and unselected word line 1010 in BLK0 (unselected erase block) 1002, the voltage level decreases at a faster rate than if selected word line 1006 was only driven from one side. FIG. 14 also illustrates that a steep discharge rate is on waveforms Unsel WLs 1404 and Unsel WLs 1410 which are also coupled by a connection circuit to a common driver.

Figure 15:
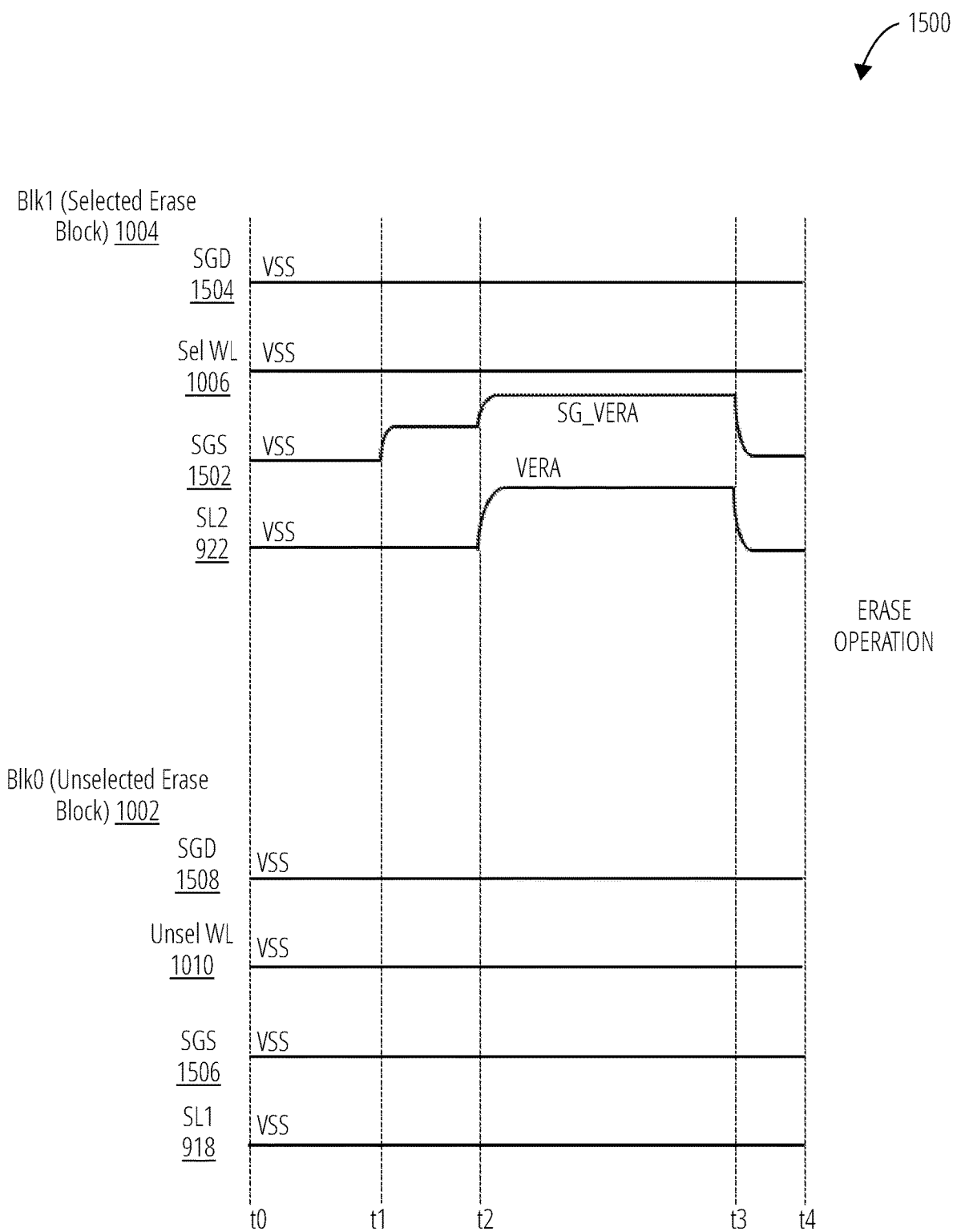
FIG. 15 illustrates waveforms 1500 in accordance with one embodiment.

FIG. 15 illustrates erase operation waveforms 1500 in accordance with one embodiment. The state machine 208 manages control logic to activate and connect voltage drivers and current sources to the different lines, nodes, and signals of the three-dimensional array to implement an erase operation. In FIG. 15 includes like numbered signals represent the same nodes, lines, gates and components described in relation to FIG. 13.

In an erase operation most of the signals remain at or near ground (e.g., Vss). In FIG. 15, SL2 922 is the signal on the second source line 922 during the erase operation. SGS 1502 is the signal on the gate terminal of the source select gate(s)

of the NAND strings of the selected erase block during the erase operation. During erase, all the word lines of selected BLK1 (selected erase block) 1004 are represented by waveform Sel WL 1006. Similarly, all the word lines of unselected BLK0 (unselected erase block) 1002 are represented by waveform Unsel WL 1010. Because the word lines of selected BLK1 (selected erase block) 1004 and word lines of unselected BLK0 (unselected erase block) 1002 are coupled to shared connection circuits, the waveforms are the same.

In the embodiment illustrated in FIG. 15, the SGS and source lines for each erase block are separate, not coupled. This way the state machine 208 can bias the SGS 1506 signal connected to the SGS of BLK0 (unselected erase block) 1002 to Vss and the voltage of the SGS 1502 signal to SG_Vera.

In certain embodiments, a connection circuit may connect each SGS of the selected erase block with each SGS of the unselected erase block and a common driver so that the state machine 208 can manage voltage applied to the gates of the SGS transistors from both sides of the three-dimensional array.

Voltage levels, not listed earlier in relation to FIG. 13 or FIG. 14, may fall within the ranges listed below:
SG_VERA—(VERA minus [5~10 Volts]
VERA—10~22 Volts
Timing events for the different phases of an erase operation are described as follows:
t0 ⇨ t1: prepare voltage generators
t2 ⇨ t3: erase storage cells of BLK1 (selected erase block) 1004.
t3 ⇨ t4: recovery.

Figure 16:
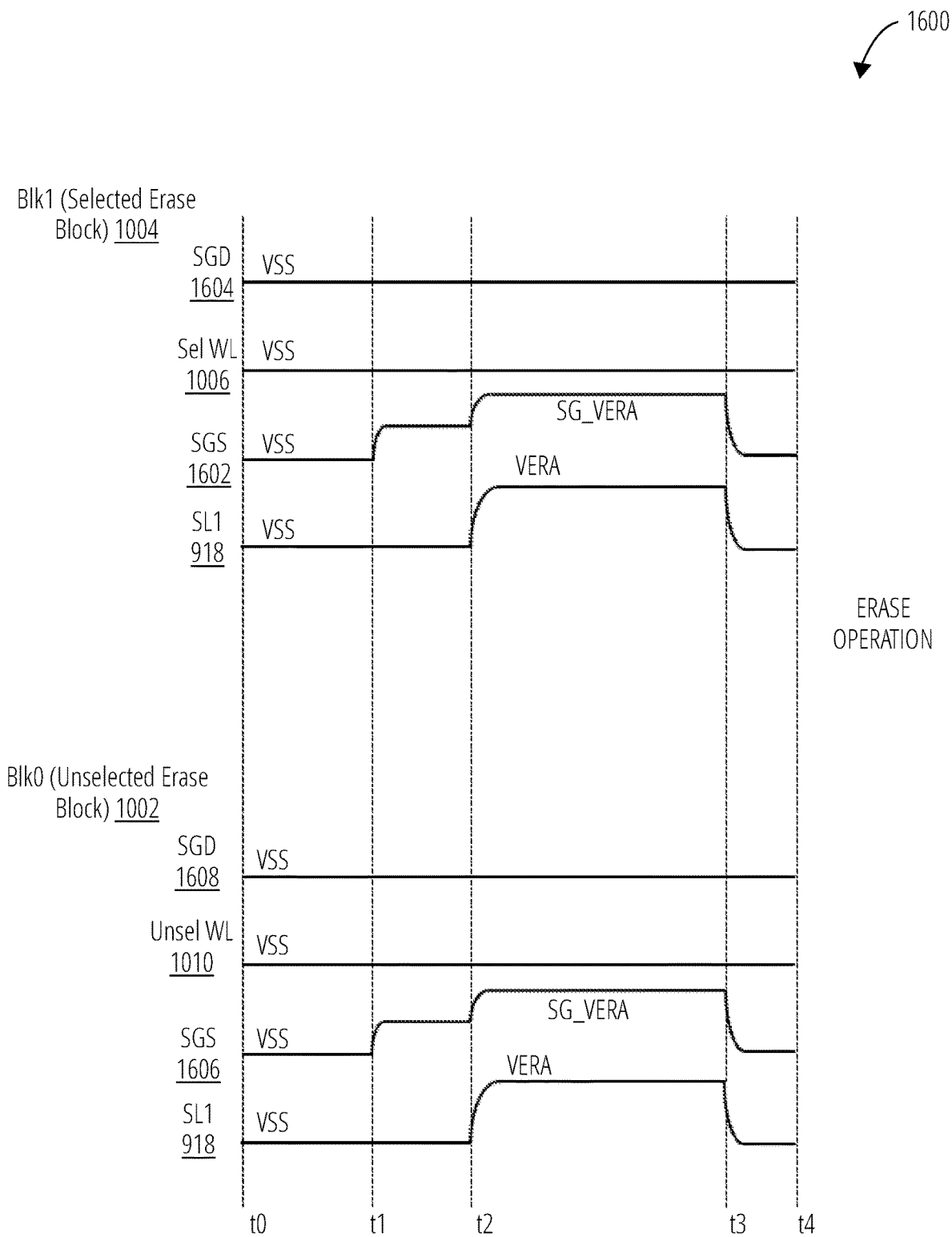
FIG. 16 illustrates waveforms 1600 in accordance with one embodiment.

FIG. 16 illustrates erase operation waveforms 1600 in accordance with one embodiment that is an alternative to the embodiment described in relation to FIG. 15. FIG. 16 includes like numbered signals representing the same nodes, lines, gates and components described in relation to FIG. 13.

In the embodiment illustrated by waveforms 1600 both BLK1 (selected erase block) 1004 and the BLK0 (unselected erase block) 1002 share the same source line, first source line 918. As is shown, the waveforms 1600 of the BLK1 (selected erase block) 1004 and BLK0 (unselected erase block) 1002 match. In this embodiment, even though there are two adjacent erase blocks, they can be erased in a single erase operation and used in the three-dimensional array as one single unitary erase block.

A means for electrically coupling each word line of a selected erase block to a corresponding word line of an unselected erase block, in various embodiments, may include connection circuit 926, connection circuit 1012, external conductive links 920, internal conductive links 924, word line interconnect 1008, first word line switch 1018, second word line switch 1020, or the like. In certain embodiments, the means for coupling each word line of a selected erase block to a corresponding word line of an unselected erase block may be formed on a substrate 602 of the memory device. Other embodiments may include similar or equivalent means for coupling each word line of a selected erase block to a corresponding word line of an unselected erase block.

A means for selectively coupling each word line of an erase block to a corresponding word line of an unselected erase block to one or more common drivers, in various embodiments, may include WLSWs positioned on one end of the word lines and WLSWs positioned on an opposite end of the word lines. Those skill in the art will recognize that while WLSWs on one end of an erase block and WLSWs on an opposite end of the word line may serve as the means for selectively coupling each word line of an erase block to a corresponding word line of an unselected erase block, other switches or gates in the connection circuit may also serve as this means. In certain embodiments, the means for selectively coupling each word line of an erase block to a corresponding word line of an unselected erase block may be one or more common drivers. The common drivers may be formed on a substrate 602 of the memory device. Other embodiments may include similar or equivalent means for selectively coupling each word line of an erase block to a corresponding word line of an unselected erase block by way of one or more common drivers.

A means for biasing NAND strings of a selected erase block and NAND strings of an unselected erase block having each word line coupled between two adjacent erase blocks for a storage operation while mitigating effects on storage cells of the unselected erase block, in various embodiments, may include die controller 206, row decoder A 218, row decoder B 220, state machine 208, read/write circuits A 222, read/write circuits B 224, an off-die controller, an off-die state machine, or the like, each of the afore listed components operated alone or in combination with any of the other afore listed components. In certain embodiments, the means for biasing NAND strings of a selected erase block and NAND strings of an unselected erase block having each word line coupled between two adjacent erase blocks for a storage operation while mitigating effects on storage cells of the unselected erase block may be formed on a substrate 602 of the memory device. Other embodiments may include similar or equivalent means for biasing NAND strings of a selected erase block and NAND strings of an unselected erase block having each word line coupled between two adjacent erase blocks for a storage operation while mitigating effects on storage cells of the unselected erase block.

Figure 17:
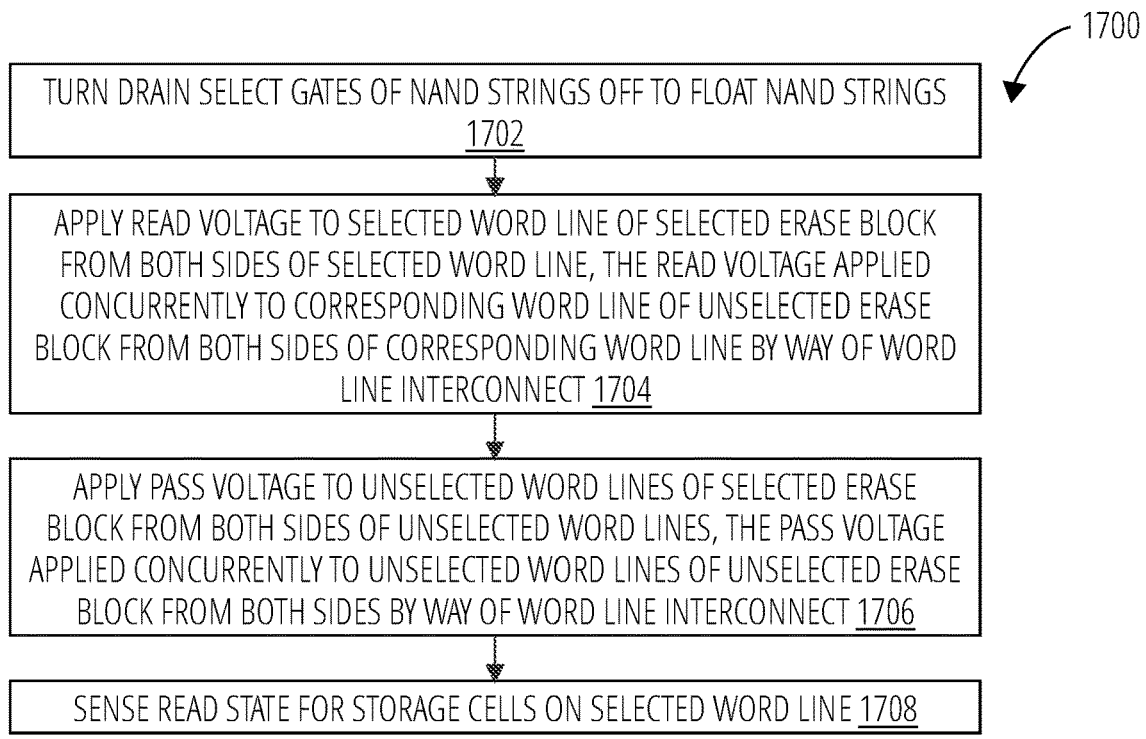
FIG. 17 illustrates a method 1700 in accordance with one embodiment.

FIG. 17 illustrates a method for performing a read operation, the method 1700 performed by a controller, for example controller 216. In block 1702, the controller turns drain select gates of the NAND strings off to float the NAND strings. In block 1704, the controller applys a read voltage to a selected word line of a selected erase block from both sides of the selected word line, the read voltage applied concurrently to a corresponding word line of the unselected erase block from both sides of the corresponding word line by way of a word line interconnect. In block 1706, the controller applys a pass voltage to unselected word lines of the selected erase block from both sides of the unselected word lines, the pass voltage applied concurrently to unselected word lines of the unselected erase block from both sides by way of a word line interconnect. In block 1708, the controller senses a read state for storage cells on the selected word line.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

Having thus described illustrative embodiments in detail, it will be apparent that modifications and variations are possible without departing from the scope of the invention as claimed.

What is claimed is:

1. A memory apparatus comprising:
    a first set of word lines, each word line of the first set of word lines extending from a first end to a second end to couple a respective row of storage cells of the memory apparatus;
    a second set of word lines, each word line of the second set of word lines extending from a first end to a second end to couple a respective row of storage cells of the memory apparatus, each word line of the second set corresponds to a word line of the first set; and
    a connection circuit configured to couple the first end of each word line of the first set of word lines to the first end of a corresponding word line of the second set of word lines and couple the second end of each word line of the first set of word lines to the second end of a corresponding word line of the second set of word lines.

2. The memory apparatus of claim 1, wherein the connection circuit comprises:
    a first word line switch configured to connect a selected word line in the first set of word lines and an unselected word line in the second set of word lines to a common driver.

3. The memory apparatus of claim 2, wherein the connection circuit is configured such that the first word line switch supplies a signal to both the selected word line and the unselected word line.

4. The memory apparatus of claim 3, further comprising a second word line switch configured to connect the unselected word line in the second set of word lines and the selected word line in the first set of word lines to the common driver.

5. The memory apparatus of claim 4, further comprising an external conductive link between one of the word lines in the first set of word lines and the corresponding word line in the second set of word lines.

6. The memory apparatus of claim 4, further comprising a trench that separates the word lines of the first set of word lines from the word lines of the second set of word lines and an internal conductive link between one of the word lines in the first set of word lines and the corresponding word line in the second set of word lines.

7. The memory apparatus of claim 6, further comprising;
    an erase block comprising the first set of word lines and the second set of word lines; and
    a die controller configured to erase the erase block in a single erase operation.

8. The memory apparatus of claim 1, comprising a first erase block comprising the first set of word lines and a second erase block comprising the second set of word lines and further comprising a three-dimensional array of the storage cells organized into a plurality of erase blocks that includes the first erase block and the second erase block, the first erase block positioned adjacent to the second erase block within the three- dimensional array.

9. An apparatus comprising:
    a three-dimensional array of NAND strings coupled to word lines, the three- dimensional array comprising a selected erase block and an unselected erase block with a trench between the selected erase block and the unselected erase block;
    a word line interconnect configured to electrically couple each word line of the selected erase block to a corresponding word line of the unselected erase block, the corresponding word line positioned in a common layer of the three-dimensional array, the word line interconnect including an external conductive link that couples a selected word line of the selected erase block to an unselected word line of the unselected erase block outside of the three-dimensional array;
    a connection circuit configured to selectively couple one or more of the word lines of the selected erase block and one or more of the word lines of the unselected erase block to a common driver; and a die controller configured to bias the NAND strings within the selected erase block and bias NAND strings within the unselected erase block in order to execute a storage operation on storage cells of the selected erase block and mitigate effects of the storage operation on storage cells of the unselected erase block.

10. The apparatus of claim 9, further comprising a first source line coupled to the selected erase block and a second source line coupled to the unselected erase block and wherein the die controller is configured to bias the NAND strings of the selected erase block and the NAND strings of the unselected erase block to execute an erase operation on the storage cells of the selected erase block.

11. The apparatus of claim 9, wherein the word line interconnect comprises a trace that spans the trench to connect each word line of the selected erase block to a corresponding word line of the unselected erase block and wherein the connection circuit comprises:
 a first word line switch configured to connect the word line in the selected erase block and the corresponding word line in the unselected erase block to the common driver; and
 a second word line switch configured to connect the corresponding word line in the unselected erase block and the word line in the selected erase block to the common driver.

12. The apparatus of claim 11, wherein the die controller is configured to activate the first word line switch and the second word line switch substantially simultaneously.

13. The apparatus of claim 9 wherein the connection circuit is further configured to selectively couple the common driver to first and second ends of the word lines of the selected and unselected erase blocks.

14. The apparatus of claim 9 wherein the word line interconnect comprises an internal conductive link formed during a fabrication process that forms a selected word line and an unselected word line of the unselected erase block within the three-dimensional array.

15. A method comprising:
 turning drain select gates of NAND strings off to float the NAND strings;
 applying a read voltage to a selected word line of a selected erase block from both ends of the selected word line, the read voltage applied concurrently to a corresponding word line of the unselected erase block from both ends of the corresponding word line by way of a word line interconnect;
 applying a pass voltage to unselected word lines of the selected erase block from both ends of the unselected word lines, the pass voltage applied concurrently to unselected word lines of the unselected erase block from both ends by way of a word line interconnect; and
 sensing a read state for storage cells on the selected word line, wherein the floating NAND strings mitigates resistive-capacitive delay on the selected word line and unselected word lines.

16. The method of claim 15, further comprising,
 activating a first word line switch configured to connect the selected word line in the selected erase block and the corresponding word line in the unselected erase block to a common driver; and
 activating a second word line switch configured to connect the the corresponding word line in the unselected erase block and the selected word line in the selected erase block to the common driver.

17. The method of claim 15, wherein a connection circuit couples each word line of the selected erase block and each corresponding word line of the unselected erase block to a common driver configured to supply the read voltage and the pass voltage.

18. The method of claim 15, wherein applying the read voltage to the selected word line of the selected erase block from both ends of the selected word line comprises connecting a first driver to the selected word line on a first end of the selected word line and connecting a second driver to the selected word line on a second end of the selected word line.

19. The method of claim 18, wherein sensing the read state for storage cells of the selected word line comprises exclusively activating sense amplifiers of the selected erase block.

20. The method of claim 15, further comprising applying a common voltage to a first source line connected to the selected erase block and to a second source line connected to the unselected erase block.

* * * * *